(12) United States Patent
Pachamuthu et al.

(10) Patent No.: US 9,460,931 B2
(45) Date of Patent: *Oct. 4, 2016

(54) HIGH ASPECT RATIO MEMORY HOLE CHANNEL CONTACT FORMATION

(71) Applicants: Jayavel Pachamuthu, Milpitas, CA (US); Johann Alsmeier, San Jose, CA (US); Raghuveer S. Makala, Sunnyvale, CA (US); Yao-Sheng Lee, Tampa, FL (US)

(72) Inventors: Jayavel Pachamuthu, Milpitas, CA (US); Johann Alsmeier, San Jose, CA (US); Raghuveer S. Makala, Sunnyvale, CA (US); Yao-Sheng Lee, Tampa, FL (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 155 days.

This patent is subject to a terminal disclaimer.

(21) Appl. No.: 14/225,176

(22) Filed: Mar. 25, 2014

(65) Prior Publication Data

US 2015/0076584 A1 Mar. 19, 2015

Related U.S. Application Data

(60) Provisional application No. 61/879,071, filed on Sep. 17, 2013.

(51) Int. Cl.
*H01L 21/28* (2006.01)
*H01L 21/8246* (2006.01)
(Continued)

(52) U.S. Cl.
CPC ... *H01L 21/28282* (2013.01); *H01L 21/28273* (2013.01); *H01L 27/1157* (2013.01); *H01L 27/11524* (2013.01); *H01L 27/11556* (2013.01); *H01L 27/11582* (2013.01);
(Continued)

(58) Field of Classification Search
CPC .................................. H01L 27/115–27/11597
See application file for complete search history.

(56) References Cited

U.S. PATENT DOCUMENTS 5,915,167 A 6/1999 Leedy
6,998,305 B2 2/2006 Arena et al.
(Continued)

FOREIGN PATENT DOCUMENTS

WO WO02/15277 A2 2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Raj R Gupta
(74) *Attorney, Agent, or Firm* — The Marbury Law Group PLLC

(57) ABSTRACT

A memory device and a method of fabricating a memory device that includes forming a protrusion over a substrate, an etch stop layer over the protrusion, and a stack of alternating material layers over the etch stop layer. The method further includes etching the stack to the etch stop layer to form a memory opening having a first width dimension proximate to the etch stop layer, etching the etch stop layer to provide a void area between the protrusion and a bottom of the memory opening, where the void area has a second width dimension that is larger than the first width dimension, forming a memory film over a sidewall of the memory opening and within the void area over the top surface of the protrusion, etching the memory film to expose the protrusion, and forming a semiconductor channel in the memory opening that is electrically coupled to the protrusion.

17 Claims, 26 Drawing Sheets

(51) Int. Cl.
*H01L 27/115* (2006.01)
*H01L 29/792* (2006.01)
*H01L 29/66* (2006.01)
*H01L 29/788* (2006.01)

(52) U.S. Cl.
CPC .. *H01L 29/66825* (2013.01); *H01L 29/66833* (2013.01); *H01L 29/7889* (2013.01); *H01L 29/7926* (2013.01)

(56) References Cited

U.S. PATENT DOCUMENTS

| | | |
|---|---|---|
| 7,005,350 B2 | 2/2006 | Walker et al. |
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,696,559 B2 | 4/2010 | Arai et al. |
| 7,745,265 B2 | 6/2010 | Mokhlesi et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,349,681 B2 | 1/2013 | Alsmeier et al. |
| 8,394,716 B2 | 3/2013 | Hwang et al. |
| 8,614,126 B1 | 12/2013 | Lee et al. |
| 8,658,499 B2 | 2/2014 | Makala et al. |
| 9,023,719 B2* | 5/2015 | Pachamuthu ..... H01L 21/28282 257/316 |
| 2007/0210338 A1 | 9/2007 | Orlowski |
| 2007/0252201 A1* | 11/2007 | Kito ................ H01L 21/8221 257/331 |
| 2009/0230449 A1 | 9/2009 | Sakaguchi et al. |
| 2009/0242967 A1* | 10/2009 | Katsumata ............ H01L 21/764 257/324 |
| 2010/0044776 A1* | 2/2010 | Ishiduki ........... H01L 27/11565 257/324 |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0320528 A1 | 12/2010 | Jeong et al. |
| 2011/0076819 A1 | 3/2011 | Kim et al. |
| 2011/0133606 A1 | 6/2011 | Yoshida et al. |
| 2011/0266606 A1 | 11/2011 | Park et al. |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0012920 A1 | 1/2012 | Shin et al. |
| 2012/0256247 A1 | 10/2012 | Alsmeier |
| 2013/0248974 A1 | 9/2013 | Alsmeier et al. |
| 2013/0264631 A1 | 10/2013 | Alsmeier et al. |
| 2013/0313627 A1 | 11/2013 | Lee et al. |
| 2014/0264525 A1 | 9/2014 | Takahashi et al. |
| 2014/0264533 A1 | 9/2014 | Simsek-Ege et al. |
| 2014/0264542 A1 | 9/2014 | Simsek-Ege et al. |
| 2014/0273373 A1 | 9/2014 | Makala et al. |
| 2014/0353738 A1 | 12/2014 | Makala et al. |
| 2015/0008503 A1 | 1/2015 | Makala et al. |
| 2015/0076580 A1* | 3/2015 | Pachamuthu ..... H01L 27/11551 257/314 |
| 2015/0200203 A1* | 7/2015 | Jang ................. H01L 27/11582 257/324 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Li at al., "Sacrificial Polymers for Nanofluidic Channels in Biological Applications", Nanotechnology 14 (2003) 578-583.

U.S. Appl. No. 13/762,988, filed Feb. 8, 2013, Makala et al.
U.S. Appl. No. 13/933,743, filed Jul. 2, 2013, Makala et al.
U.S. Appl. No. 14/225,116, filed Mar. 25, 2014, Pachamuthu et al.

Invitation to Pay Additional Fees and International Searching Authority including Communication Relating to the Results of the Partial International Search for PCT/US2014/047480 mailed Oct. 7, 2014.

International Search Report and Written Opinion received in connection with international Application No. PCT/US2014/047480; mailed Jan. 5, 2015.

Notice of Allowance and Fee(s) Due for U.S. Appl. No. 14/225,116, filed Mar. 25, 2014 (12 pages).

International Preliminary Report on Patentability and Written Opinion of the International Searching Authority for International Application No. PCT/US2014/047480, dated Mar. 31, 2016, 16 pages.

* cited by examiner

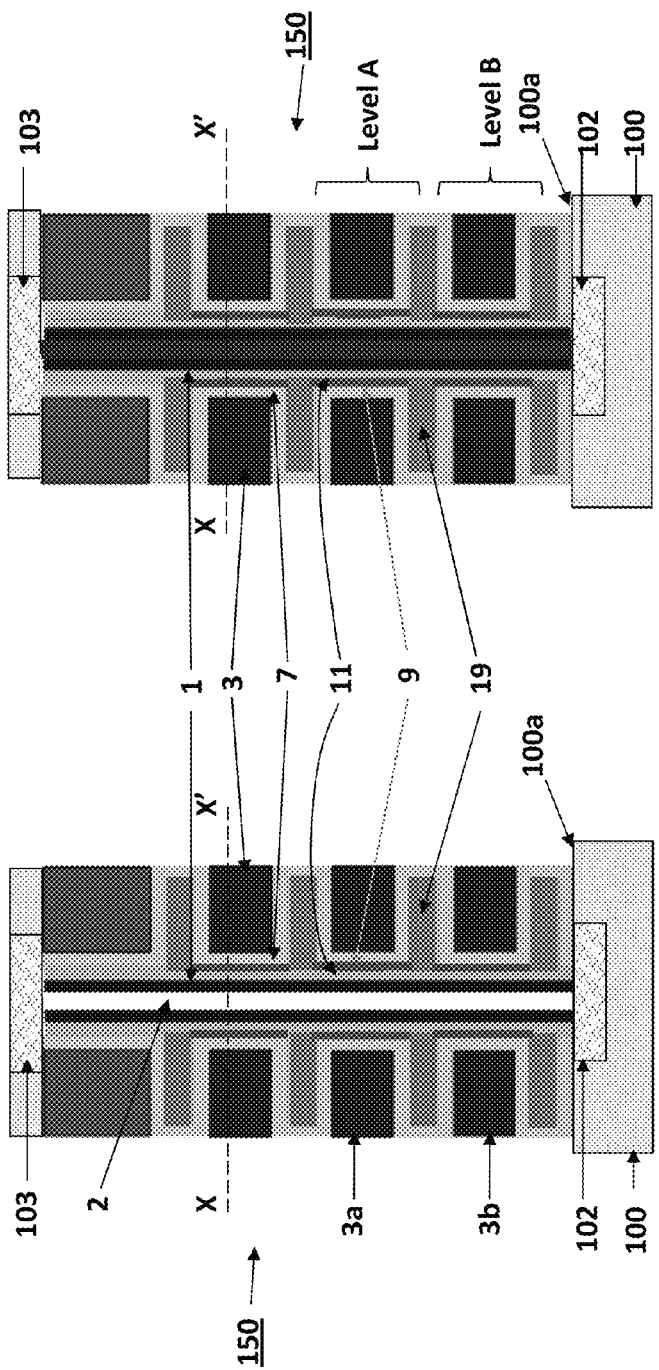

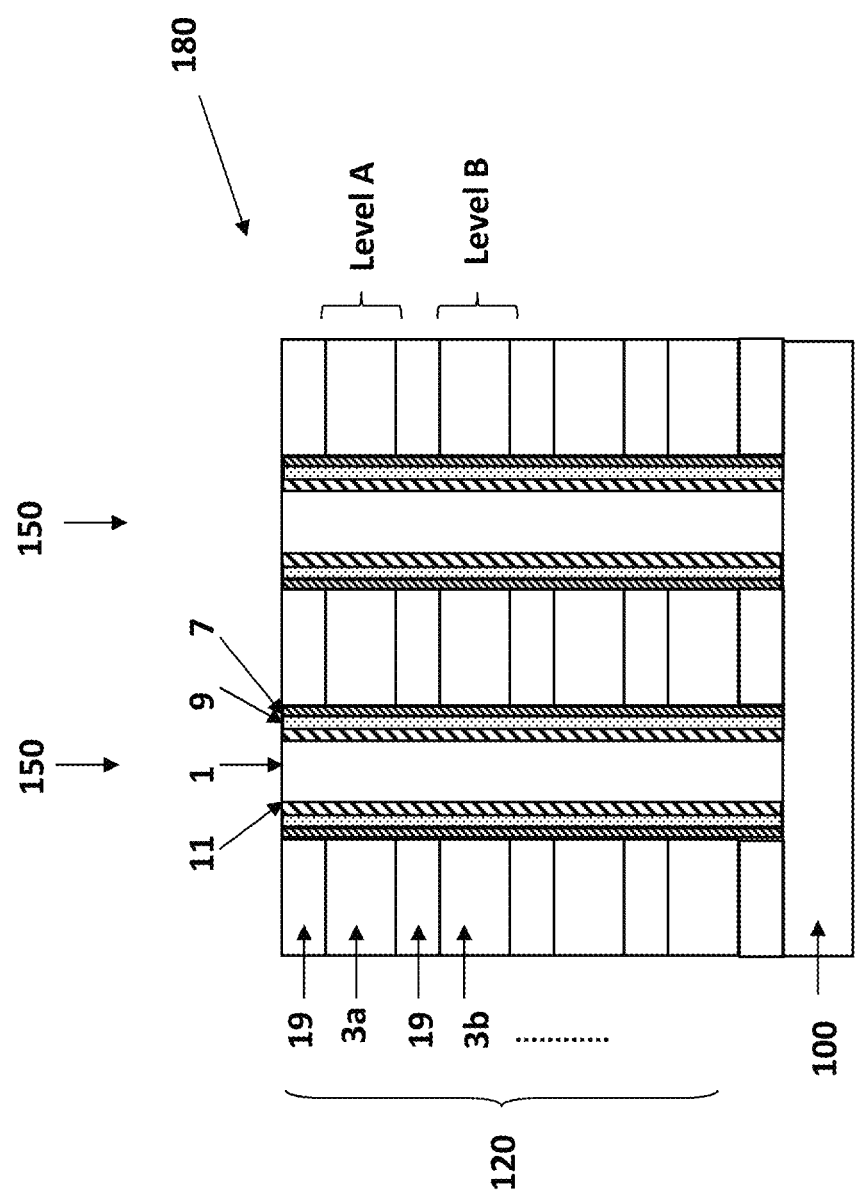

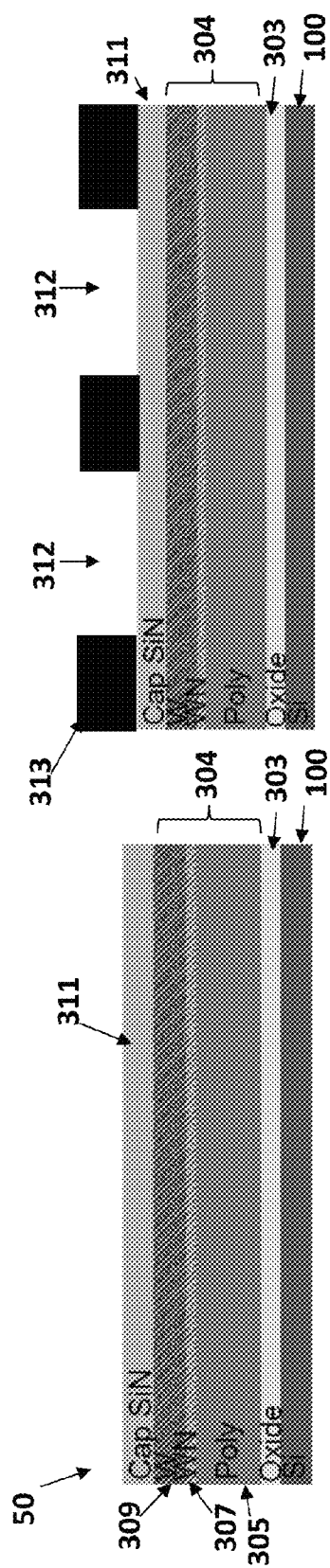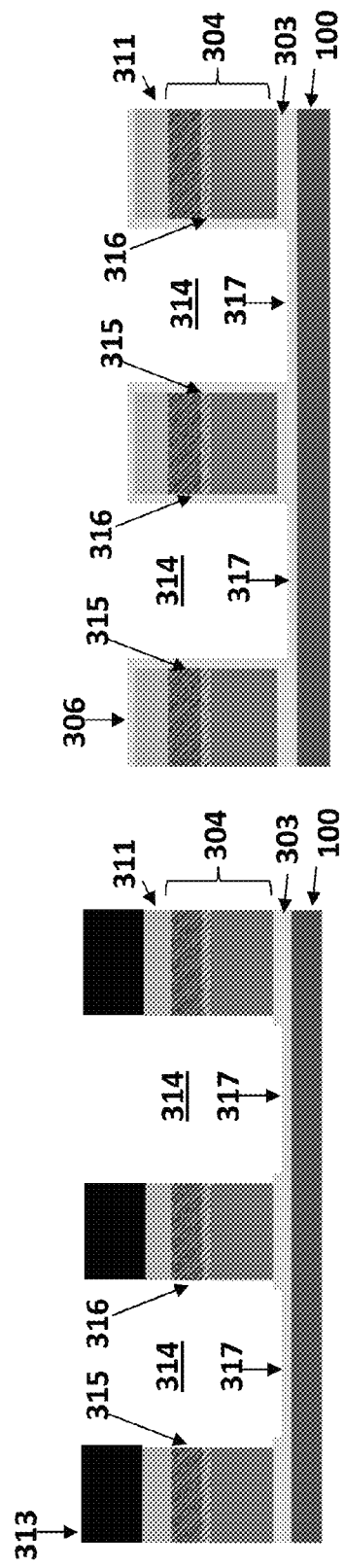

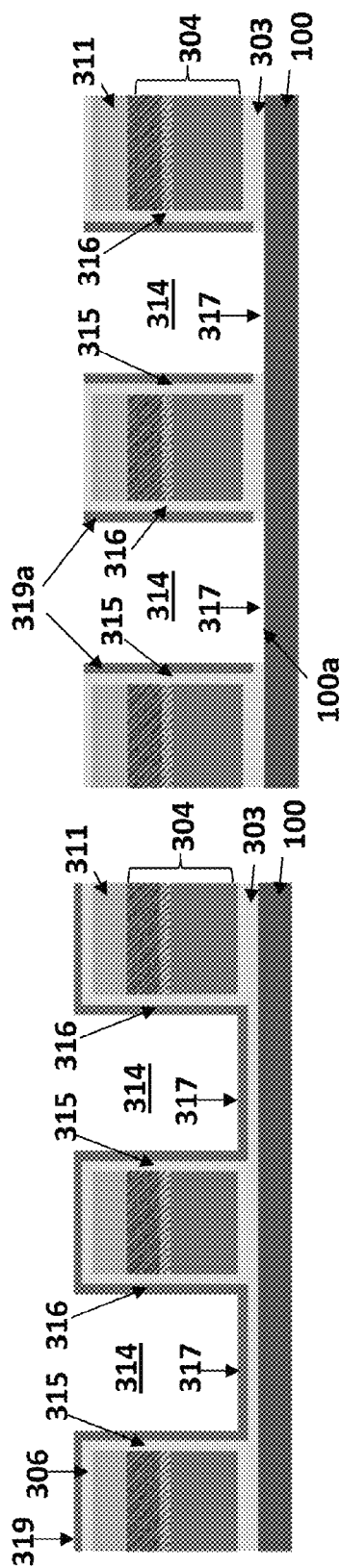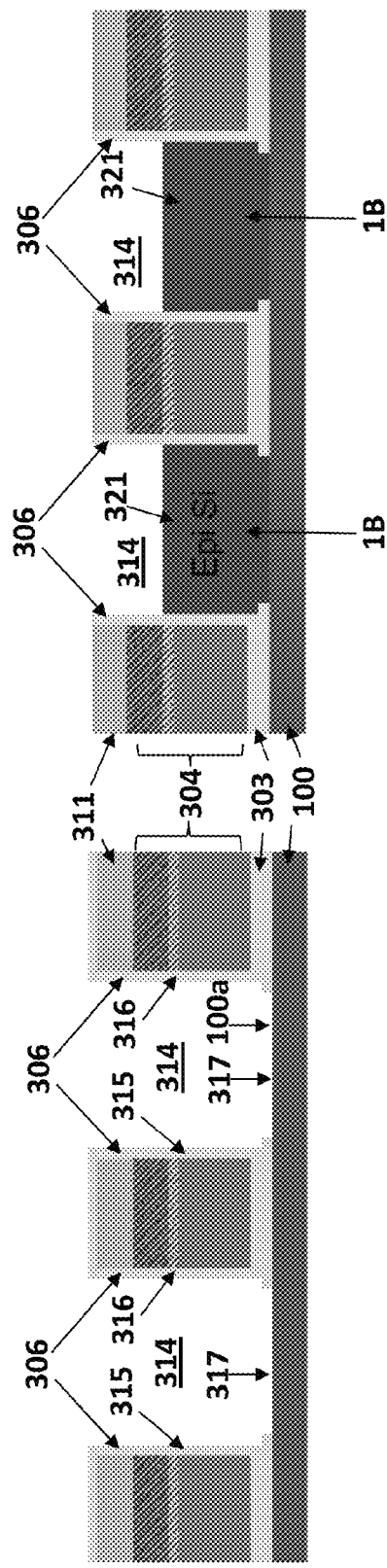

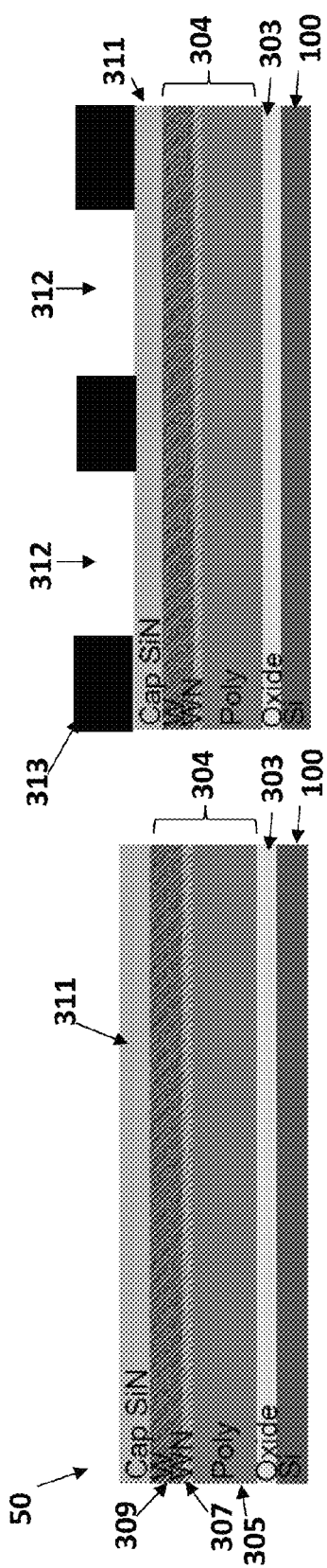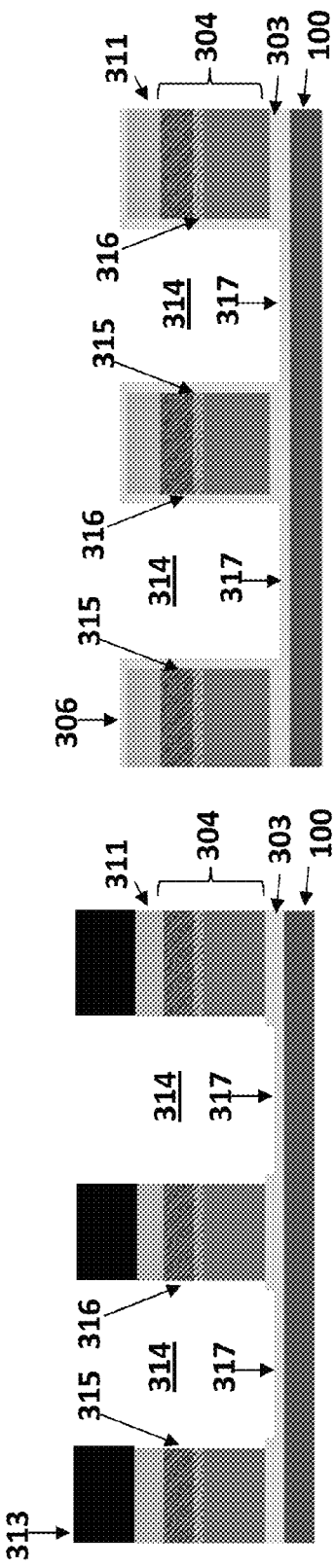

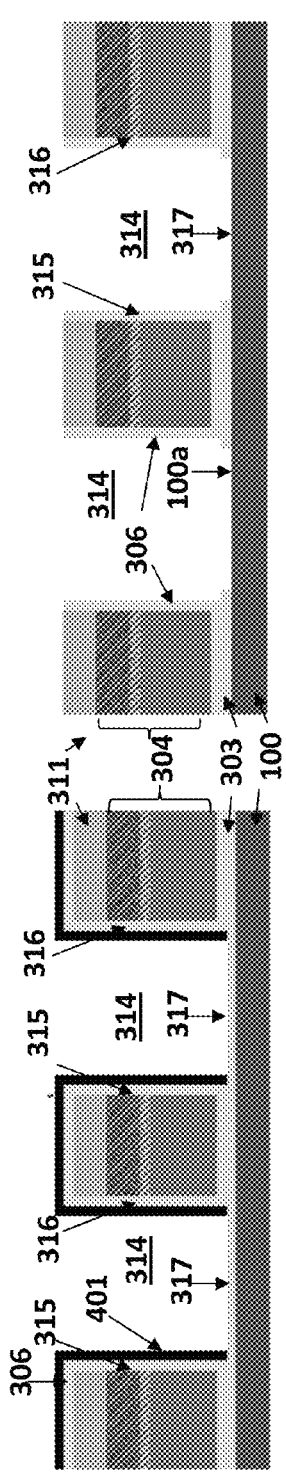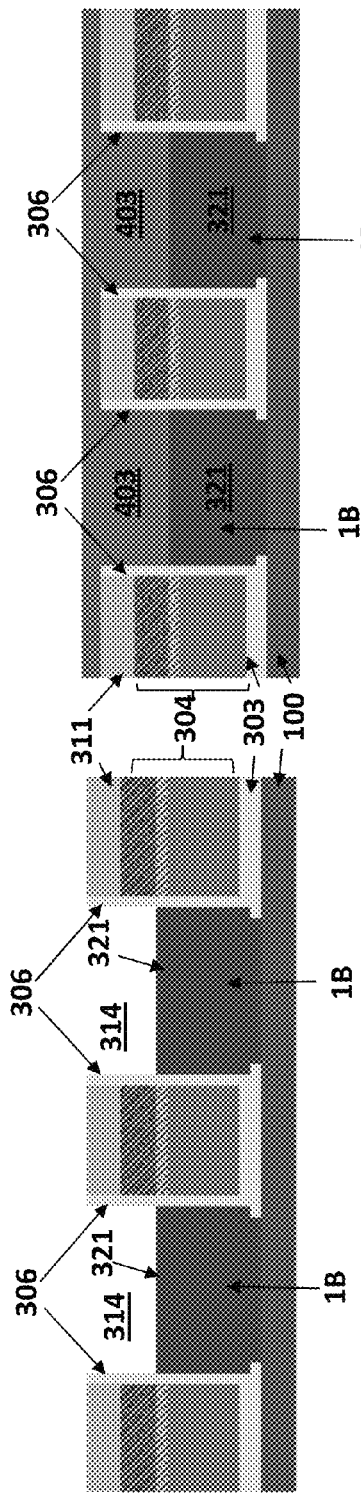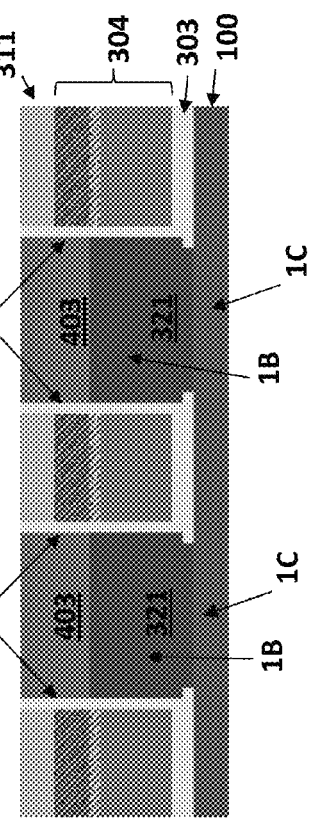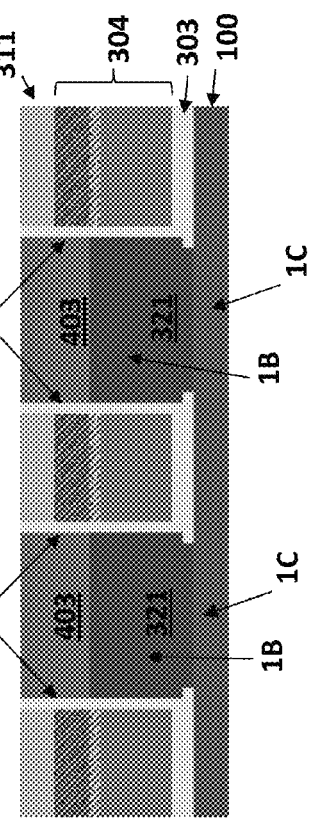
Fig. 4E
Fig. 4F
Fig. 4G
Fig. 4H
Fig. 4I

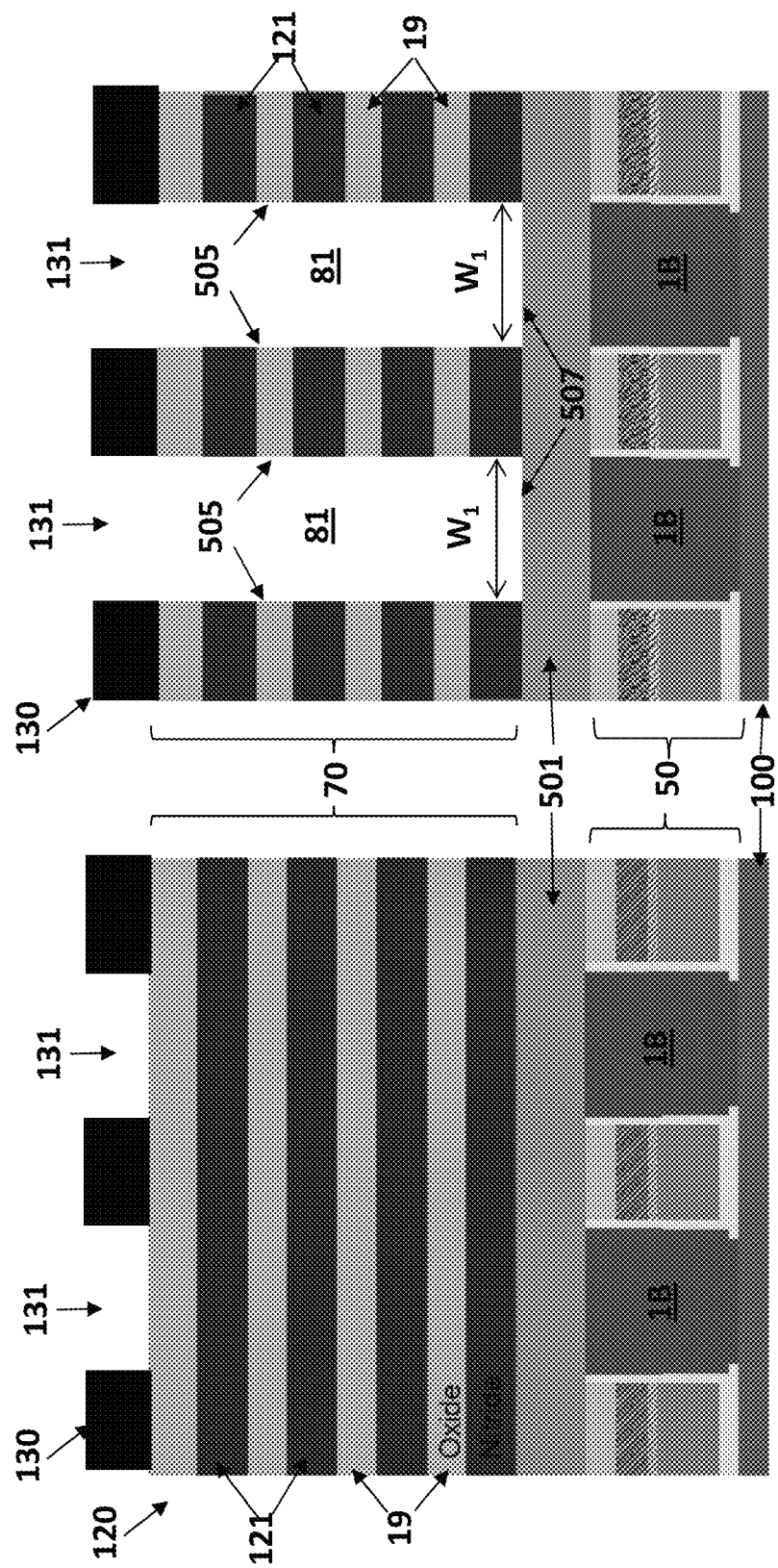

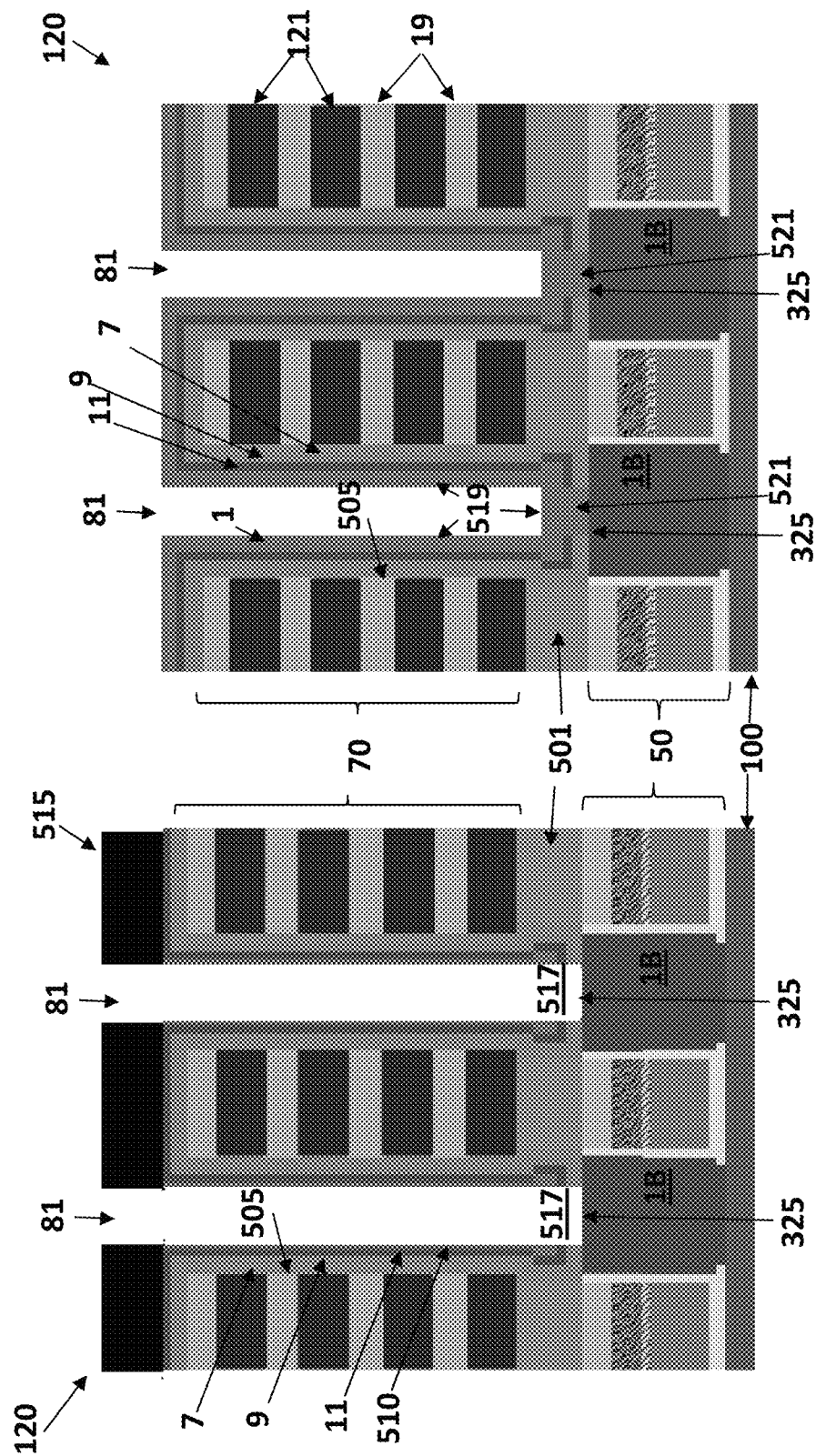

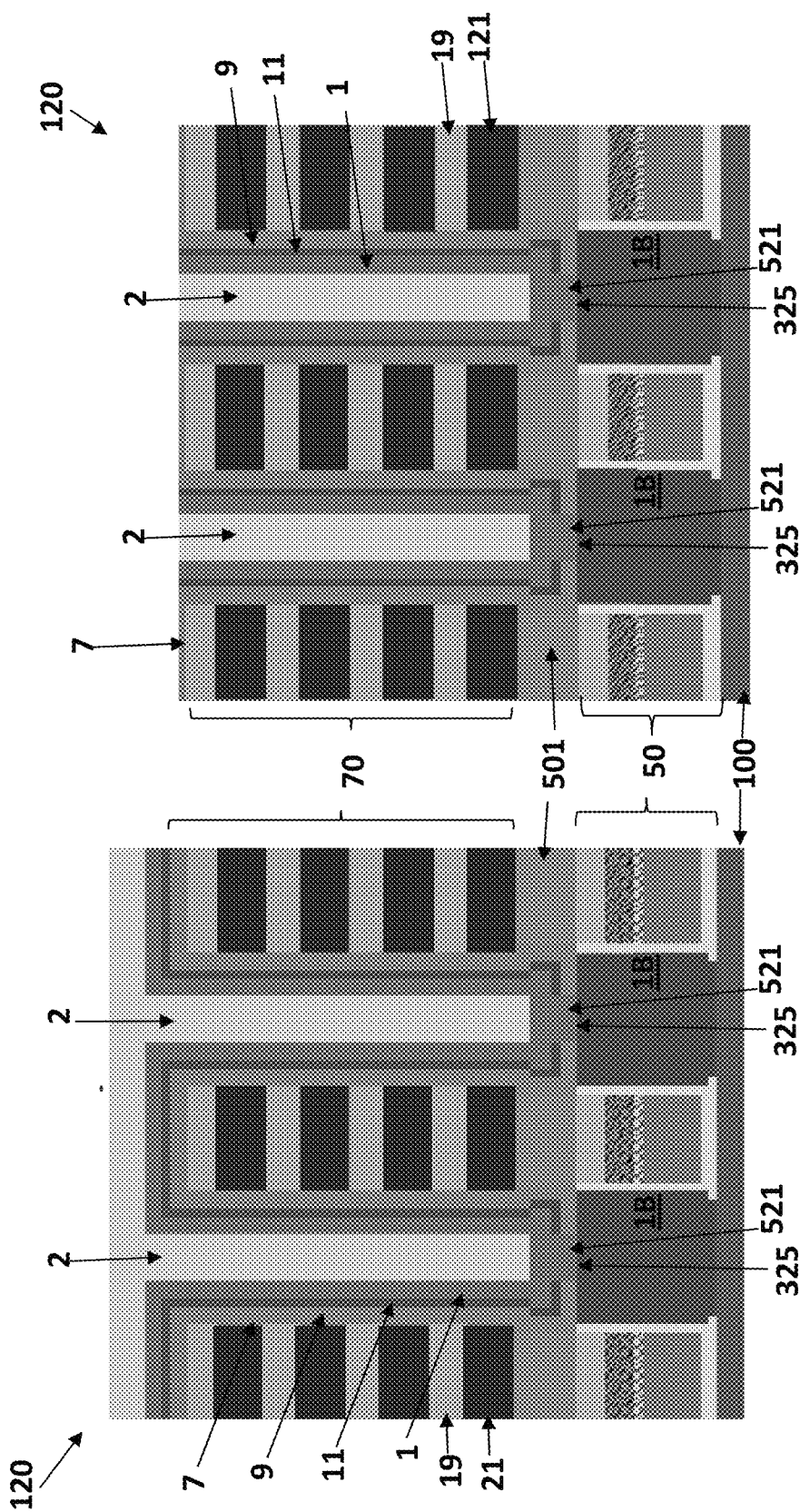

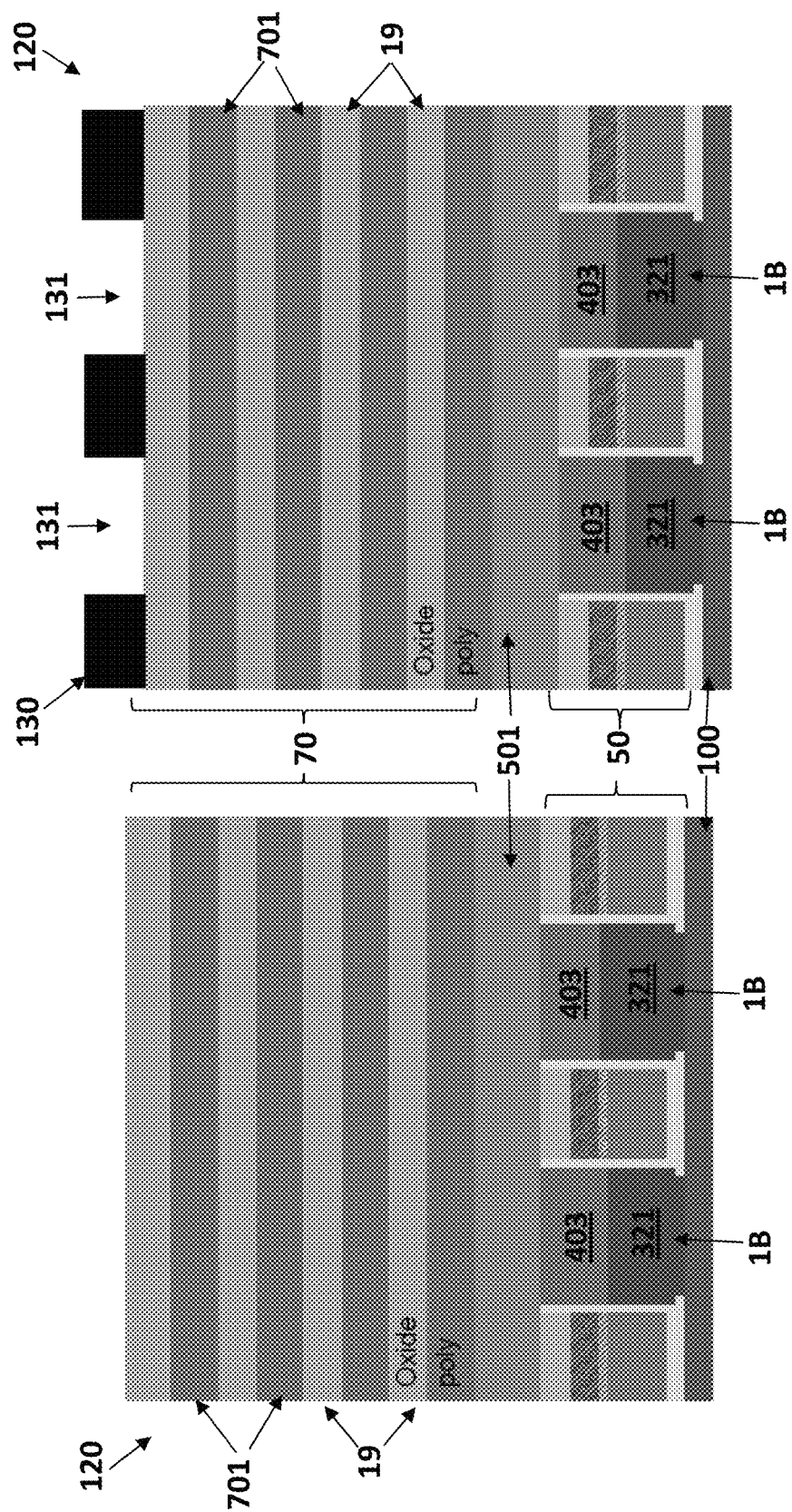

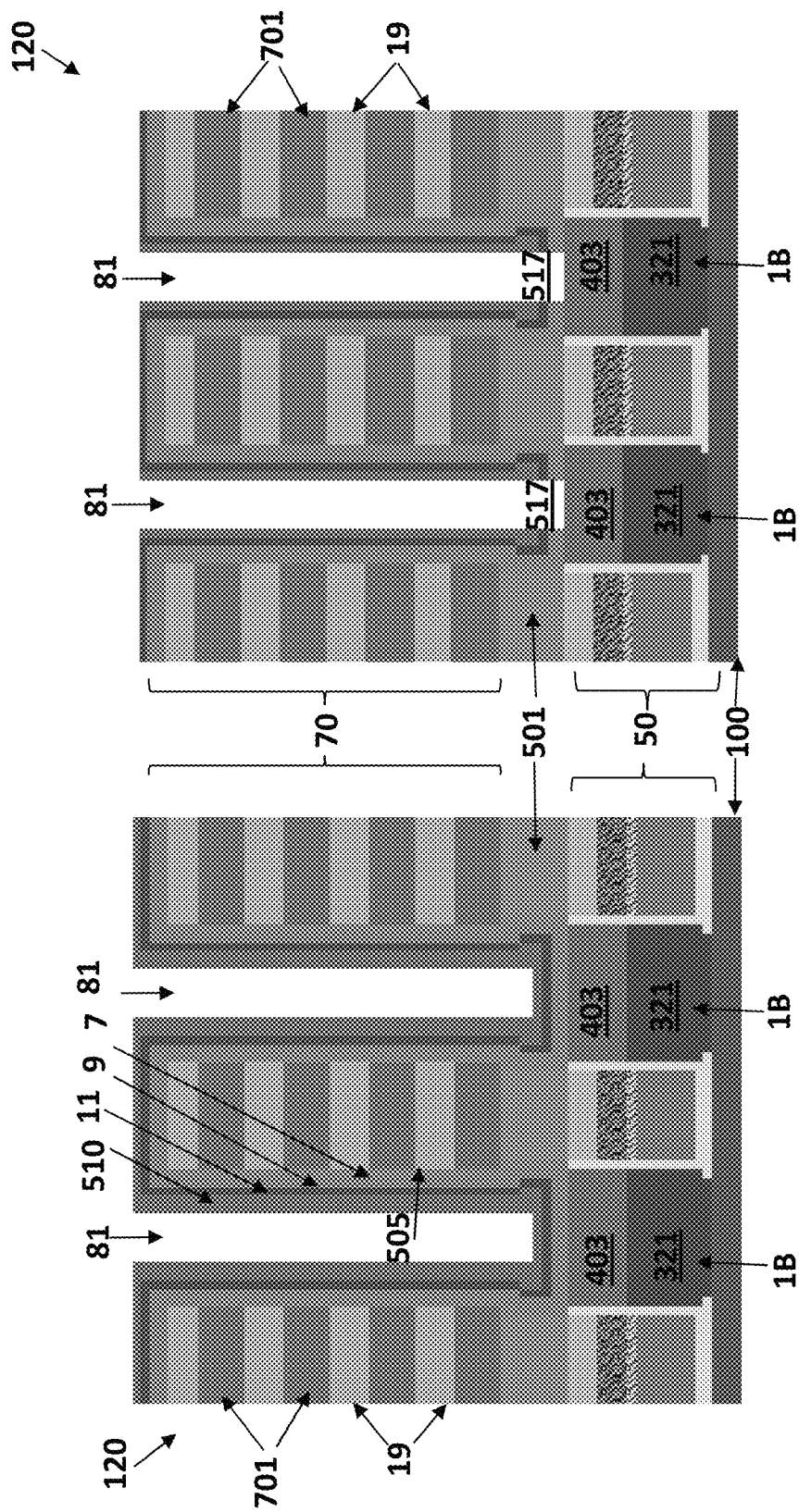

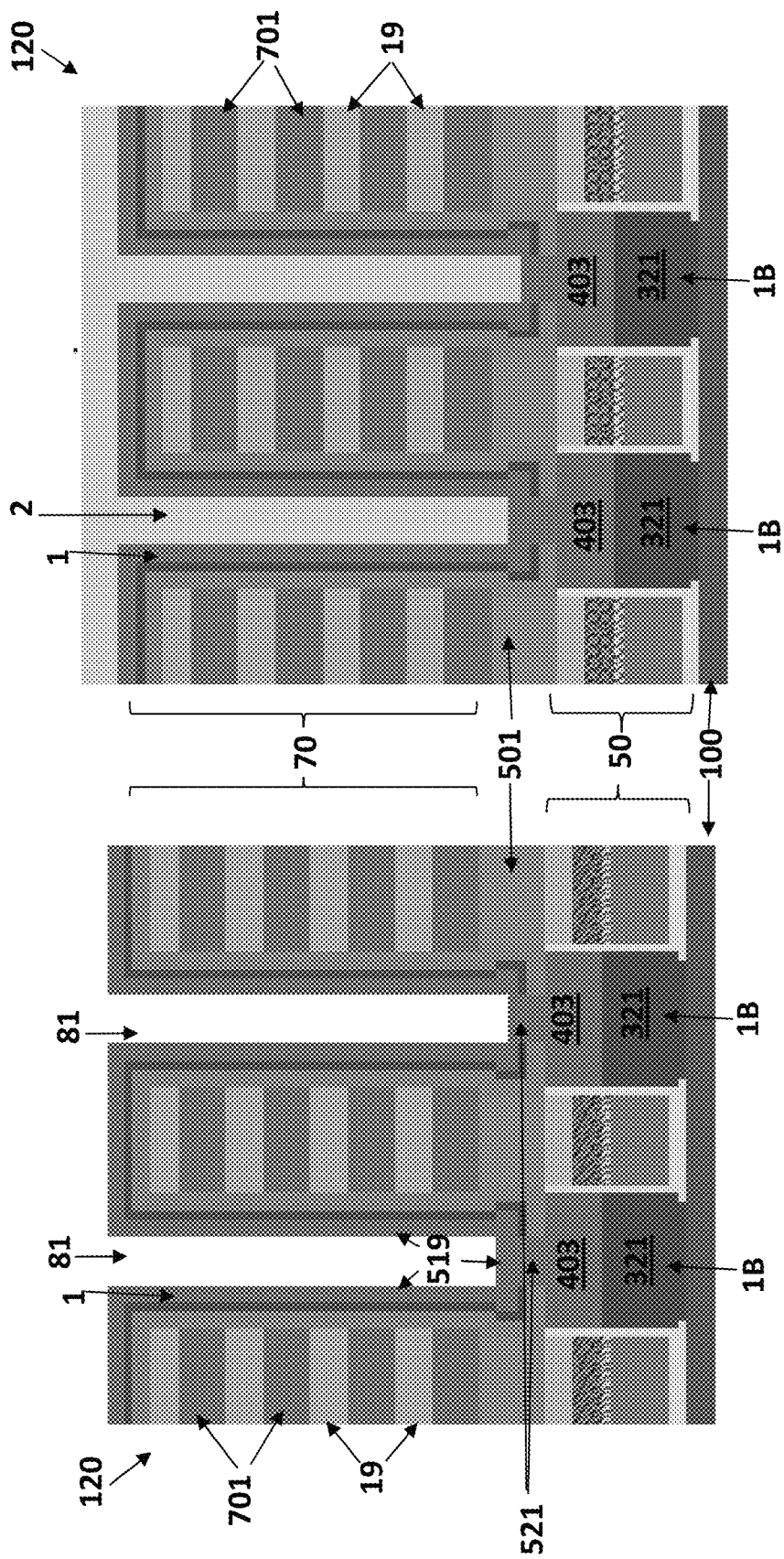

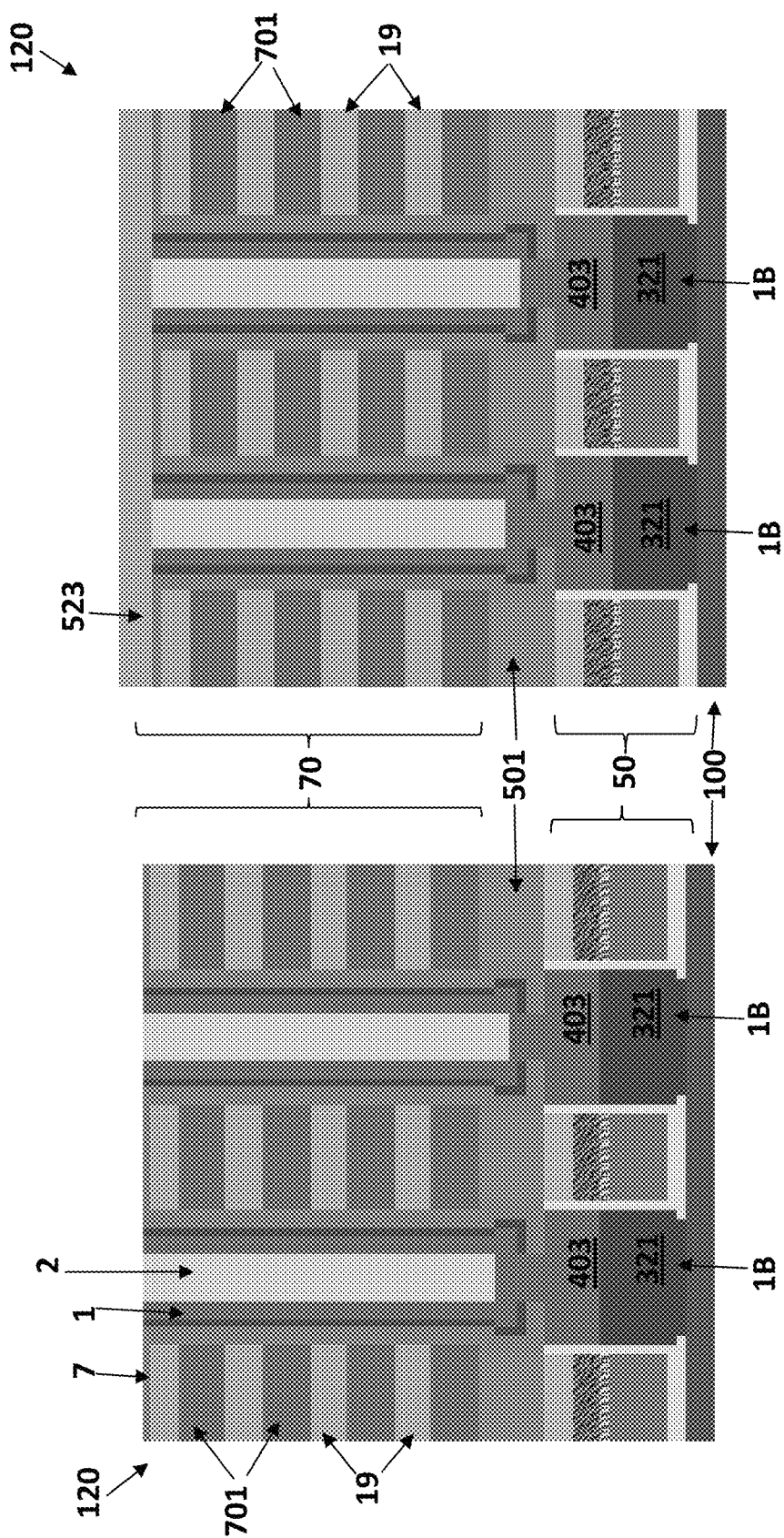

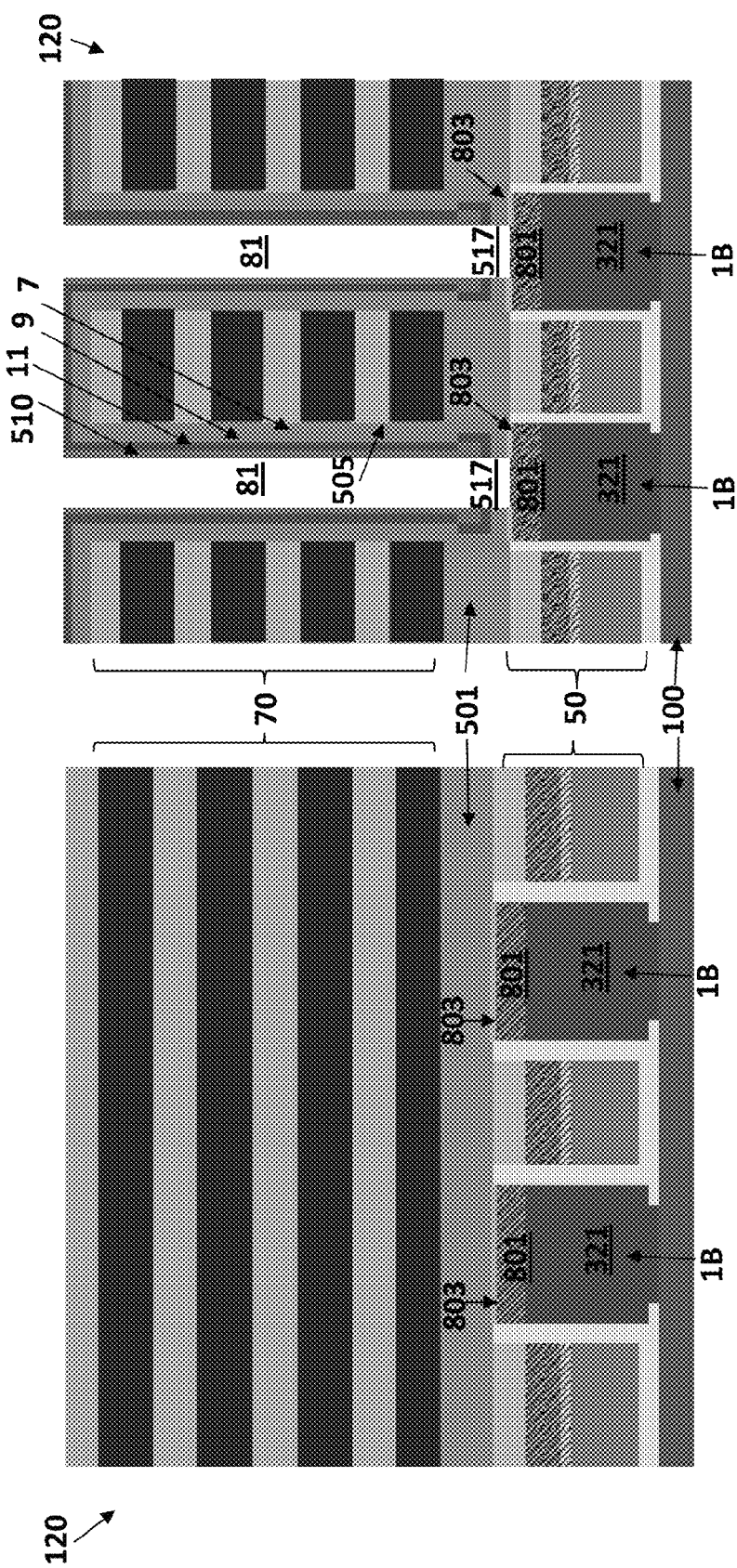

HIGH ASPECT RATIO MEMORY HOLE CHANNEL CONTACT FORMATION

RELATED APPLICATION

This application claims the benefit of priority to U.S. Provisional Application No. 61/879,071, filed Sep. 17, 2013, the entire contents of which are incorporated by reference herein.

FIELD

The present invention relates generally to the field of semiconductor devices and specifically to three dimensional non-volatile memory, such as vertical NAND strings, and other three dimensional devices and methods of making thereof.

BACKGROUND

Recently, ultra high density storage devices have been proposed using a three-dimensional (3D) stacked memory structure sometimes referred to as a Bit Cost Scalable (BiCS) architecture. For example, a 3D NAND stacked memory device can be formed from an array of alternating conductive and dielectric layers. A memory hole is formed through the layers to define many memory layers simultaneously. A NAND string is then formed by filling the memory hole with appropriate materials. A straight NAND string extends in one memory hole, while a pipe- or U-shaped NAND string (p-BiCS) includes a pair of vertical columns of memory cells

SUMMARY

Embodiments relate to a method of fabricating a memory device that includes forming a protrusion comprising a semiconductor material over a major surface of a semiconductor substrate, the protrusion having a top surface substantially parallel to the major surface of the substrate, forming an etch stop layer over the top surface of the protrusion, forming a stack of alternating layers of a first material and a second material different from the first material over the etch stop layer, etching the stack through a mask to the etch stop layer to form a memory opening having a first width dimension proximate to the etch stop layer, etching the etch stop layer to provide a void area between the top surface of the protrusion and a bottom of the memory opening, the void area having a second width dimension that is larger than the first width dimension, forming at least a portion of a memory film over a sidewall of the memory opening and within the void area over the top surface of the protrusion, etching the memory film to expose the top surface of the protrusion, and forming a semiconductor channel in the memory opening such that the semiconductor channel is electrically coupled to the protrusion and the at least a portion of the memory film is located between the semiconductor channel and the sidewall of the memory opening.

Further embodiments relate to a memory device, such as a three-dimensional NAND string memory device, that includes a semiconductor substrate having a major surface, a protrusion comprising a semiconductor material over the major surface of the semiconductor substrate, the protrusion having a top surface substantially parallel to the major surface of the substrate, a first side surface and a second side surface opposite the first side surface, a select gate electrode extending over and parallel to the major surface of the semiconductor substrate and adjacent to the first and second side surfaces of the protrusion, and a gate insulating layer extending between the select gate electrode and the major surface of the substrate and between the select gate electrode and the first and second side surfaces of the protrusion. A stack of alternating insulating material layers and control gate electrodes are located over the substrate above the protrusion and the select gate electrode and includes a memory opening extending through the layer stack in a direction substantially perpendicular to the major surface of the substrate. A semiconductor channel having at least one first portion extends substantially perpendicular to the major surface of the substrate in the memory opening and at least one memory film is located in the memory opening adjacent to the semiconductor channel, wherein a first portion of the memory film is located between the control gate electrodes and the first portion of the semiconductor channel, and a second portion of the memory film extends over the top surface of the protrusion and defines a generally cylindrically-shaped connector region of the memory opening. A generally cylindrically-shaped connector is located within the connector region and electrically connects the protrusion to the semiconductor channel, wherein the memory opening above the connector region is wider than in the connector region.

BRIEF DESCRIPTION OF THE DRAWINGS

FIGS. 1A-1B are respectively side cross sectional and top cross sectional views of a NAND string of one embodiment. FIG. 1A is a side cross sectional view of the device along line Y-Y' in FIG. 1B, while FIG. 1B is a side cross sectional view of the device along line X-X' in FIG. 1A.

FIGS. 1C-1D are respectively side cross sectional and top cross sectional views of a NAND string of another embodiment. FIG. 1C is a side cross sectional view of the device along line Y-Y' in FIG. 1D, while FIG. 1D is a side cross sectional view of the device along line X-X' in FIG. 1C.

FIG. 2 is a partial side cross-sectional view of a memory device comprising a plurality of NAND strings formed in a stack of material layers over a substrate.

FIGS. 3A-3I are partial side cross-sectional views of a stack of material layers over a substrate and illustrate a method of forming a select gate level of a memory device according to an embodiment.

FIGS. 4A-4I are partial side cross-sectional views of a stack of material layers over a substrate and illustrate a method of forming a select gate level of a memory device according to another embodiment.

FIGS. 5A-5J are partial side cross-sectional views of a material layer stack over a substrate that illustrate a method of fabricating NAND memory strings according to one embodiment.

FIGS. 7A-7J are partial side cross-sectional views of a material layer stack over a substrate that illustrate a method of fabricating NAND memory strings according to another embodiment.

FIGS. 8A-8F are partial side cross-sectional views of a material layer stack that illustrate a method of forming a select gate level and a plurality of NAND strings with a metal silicide channel contact area according to an embodiment.

DETAILED DESCRIPTION

Figure 3I:
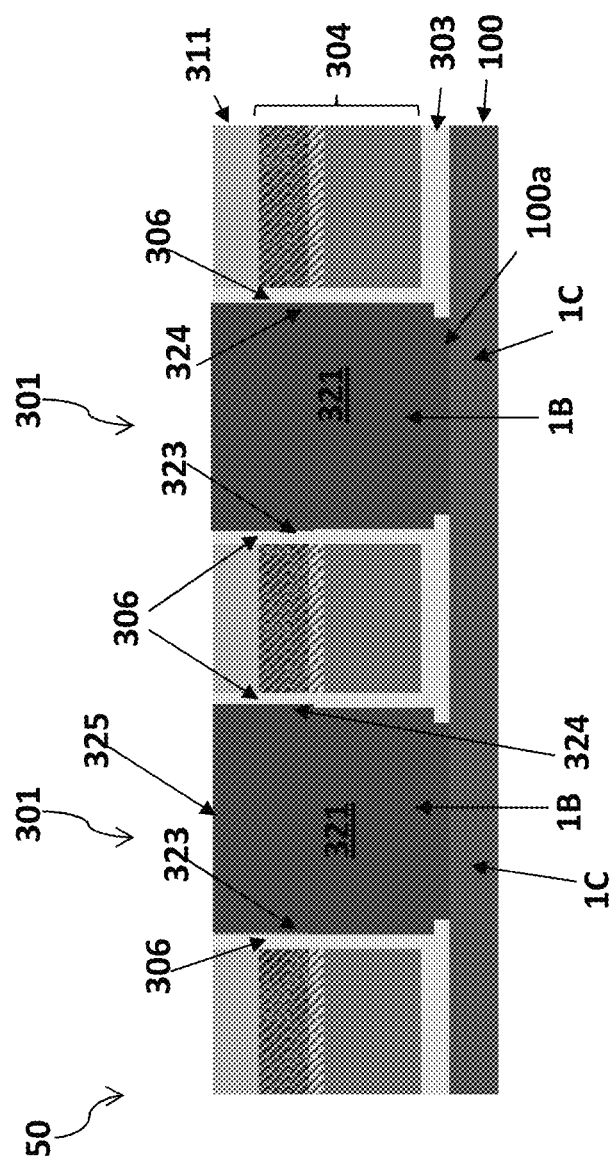

The embodiments of the invention provide a method for fabricating a semiconductor device, such as a three dimensional monolithic memory array comprising a plurality of NAND memory strings.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

In some embodiments, a monolithic three dimensional NAND string 150 comprises a semiconductor channel 1 having at least one end portion extending substantially perpendicular to a major surface 100a of a substrate 100, as shown in FIGS. 1A, 1C and 2. For example, the semiconductor channel 1 may have a pillar shape extending through a plurality of memory device levels (Level A, Level B, etc.) and the entire pillar-shaped semiconductor channel in the memory device levels extends substantially perpendicularly to the major surface 100a of the substrate 100, as shown in FIGS. 1A, 1C and 2. The channels 1 may be electrically connected to first and second (e.g., source and drain) electrodes 102, 103 which are schematically shown in FIGS. 1A and 1C. The first (e.g., source) electrode 102 may connect to the bottom of the channel 1 and the second (e.g., drain electrode 103) may connect to the top of the channel 1. The NAND string 150 may further include drain-side and source-side select or access transistors (not shown in FIGS. 1A-2 for clarity) which may be located above and below the memory levels of the NAND string 150, respectively.

In some embodiments, the semiconductor channel 1 may be a filled feature, as shown in FIGS. 1C and 1D. In some other embodiments, the semiconductor channel 1 may be hollow, for example a hollow cylinder filled with an insulating fill material 2, as shown in FIGS. 1A and 1B. In these embodiments, an insulating fill material 2 may be formed to fill the hollow part surrounded by the semiconductor channel 1.

A memory device 180 may comprise a plurality of NAND strings 150 formed in a stack 120 of material layers over the substrate 100, as shown in FIG. 2. The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recyrstallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND strings 150 further comprise a plurality of control gate electrodes 3 as shown in FIGS. 1A-2. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., memory device level A) and a second control gate electrode 3b located in a second device level (e.g., memory device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride, alloys thereof or combination of these materials. For example, the control gate material in FIGS. 1A-1D may comprise a conductive metal or metal alloy, such as tungsten, titanium nitride, and/or tungsten nitride, while the control gate material in FIG. 2 may comprise doped polysilicon.

A blocking dielectric 7 is located adjacent to the control gate(s) 3 and may surround the control gate 3, as shown in FIGS. 1A and 1C. Alternatively, a straight blocking dielectric layer 7 may be located only adjacent to an edge (i.e., minor surface) of each control gate 3, as shown in FIG. 2. The blocking dielectric 7 may comprise one or more layers having plurality of blocking dielectric segments located in contact with a respective one of the plurality of control gate electrodes 3. Alternatively, the blocking dielectric 7 may comprise one or more continuous layers which extend the entire length of the memory cell portion of the NAND string 150, as shown in FIG. 2.

The monolithic three dimensional NAND string also comprise a charge storage region 9. The charge storage region 9 may comprise one or more continuous layers which extend the entire length of the memory cell portion of the NAND string as shown in FIG. 2. For example, the charge storage region 9 may comprise an insulating charge trapping material, such as a silicon nitride layer. Alternatively, the charge storage region may comprise a plurality of discrete charge storage regions or segments 9 located between the blocking dielectric 7 and the channel 1, as shown in FIGS. 1A and 1C. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments. Alternatively, the charge storage region 9 may comprise conductive nanoparticles, such as metal nanoparticles, for example ruthenium nanoparticles.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials, such as metal oxide materials, for example aluminum oxide or hafnium oxide. The blocking dielectric 7 and/or the tunnel dielectric 11 may include multiple layers of silicon oxide, silicon nitride and/or silicon oxynitride (e.g., ONO layers).

In various embodiments, the three-dimensional NAND string 150 may have a generally pillar shape that extends substantially perpendicular to the major surface of the substrate 100, with a first (e.g., drain) electrode 103 that connects to the NAND string 150 at the top of the NAND string 150 (i.e., distal to the substrate 100) and a second (e.g., source) electrode 102 that connects to the NAND string 150 at the bottom of the NAND string 150 (i.e., proximate to the substrate 100). In embodiments, each NAND string 150 may have a first select or access transistor (e.g., a drain-side select gate transistor) located above the memory levels of the NAND string 150, and a second select or access transistor (e.g., a source-side select gate transistor) located below the memory levels of the NAND string 150. Since the second or source-side select gate transistor is located below the memory levels of the NAND string 150, forming effective contact between the semiconductor channel 1 of the NAND string 150 and the underlying select gate region of the device has proven challenging, particularly for high aspect ratio NAND strings 150.

Various embodiments include methods of making a memory device such as a monolithic three-dimensional NAND string memory device. FIGS. 3A-3I illustrate a method of making a memory device according to a first, non-limiting embodiment of the invention. The method of FIGS. 3A-3I may result in a higher quality gate insulating layer 306 for the source side select gate transistor 301. Specifically, a select gate electrode 304 may be formed over a first gate insulating layer 303 over a major surface 100a of the substrate 100. Then, the select gate electrode 304 is etched through a mask to form one or more openings 314 having vertically-extending sidewalls 315, 316 and a horizontally-extending bottom surface 317. A second gate insulating layer 306 is formed on the sidewalls 315, 316 of the openings, and a sacrificial spacer layer 319 is formed over the second gate insulating layer 306 on the sidewalls 315, 316 of the opening 314. Then, the horizontal portions of the gate insulating layer 306 are etched, such as by reactive ion etching, to expose the major surface of the substrate 100 under the gate insulating layer 306, while the sacrificial spacer layer 319 protects the vertically-extending portions of the gate insulating layer 306 over the sidewalls of the openings. The sacrificial spacer layer is then removed from the sidewalls. A protrusion comprising a semiconductor material, which later forms a channel portion 1B of the NAND string 150, is then formed in the opening, with the gate insulating layer 306 on the sidewalls 315, 316 of the opening 314 being located between the select gate electrode 304 and the first and second side surfaces 323, 324 of the protrusion. The gate insulating layer 306 is not subject to processing damage because it is protected by the sacrificial spacer layer 319 while the bottom surface of the opening 314 is etched to expose the surface of the semiconductor substrate 100. Thus, the vertical portions of the gate insulating layer 306 are not subjected to etching damage and may be higher quality than in prior art devices.

FIG. 3A illustrates a select gate portion 50 of a NAND string memory device according to one embodiment. To form the select gate portion 50 of FIG. 3A, a first gate insulating layer 303 (e.g., an oxide layer) may be formed over the surface of a semiconductor substrate 100. The first gate insulating layer 303 may be formed by oxidation of the exposed surface of the semiconductor (e.g., silicon) substrate 100. Any suitable oxidation process may be used, such as radical oxidation, dry oxidation, wet oxidation, etc to form a silicon oxide layer 303. Alternatively, rather than oxidizing the exposed surface, a layer 303 of insulating material, such as silicon oxide, may be deposited by chemical vapor deposition ("CVD") or sputtering.

One or more layers 305, 307, 309 of electrically conductive material are then deposited over the first gate insulating layer 303 to form the select gate electrode 304. The select gate electrode 304 may comprise any suitable conductive material, such as a metal or metal alloy or doped semiconductor layer, and may be formed using any suitable process, such as via physical or chemical vapor deposition processes. In the embodiment of FIG. 3A, the select gate electrode 304 includes a doped polysilicon layer 305 over the first gate insulating layer 303, a metal nitride (e.g., tungsten nitride) liner layer 307 over the doped polysilicon layer 305, and a metal (e.g., tungsten) layer 309 over the metal nitride liner layer 307. An upper layer 311 of an insulating material (e.g., silicon nitride) may be provided over the select gate electrode 304.

A mask layer 313 is then formed over the upper layer 311 of insulating material. As shown in FIG. 3B, the mask layer 313 is patterned into a mask pattern defining open portions 312 in which layer 311 is exposed. The mask layer 313 may comprise any suitable mask layer, such as photoresist or a hard mask material, such as amorphous carbon, silicon nitride, metal, etc., and may be patterned using photolithography. In FIG. 3C, the upper layer 311 of insulating material and the select gate electrode 304 are etched through the mask 313 to the first gate insulating layer 303 to form openings 314 corresponding to the locations of the open portions 312 in the mask 313. The layers 311, 304 may be etched using reactive ion etching (RIE), for example. The select gate electrode 304 may form at least a portion of the sidewalls 315, 316 of each opening 314, and the first gate insulating layer 303 may form the bottom surface 317 of each opening 314. The mask layer 313 may be removed, as shown in FIG. 3D.

A second gate insulating layer 306 may be formed over the upper layer 311 of insulating material and in the openings 314 over the sidewalls 315, 316 and bottom surface 317 of each opening 314, as shown in FIG. 3D. The second gate insulating layer 306 may comprise an insulating material, such as silicon oxide, may be deposited using a suitable process such as by chemical vapor deposition ("CVD") or sputtering.

A sacrificial spacer layer 319 may be formed over the second gate insulating layer 306, including in the openings 314 over the sidewalls 315, 316 and bottom surface 317 of each opening 314, as shown in FIG. 3E. The sacrificial spacer layer 319 may comprise an insulating material, such as silicon nitride, may be deposited using a suitable process such as by chemical vapor deposition ("CVD") or sputtering.

In FIG. 3F, the sacrificial spacer layer 319, the second gate insulating layer 306 and the first gate insulating layer 303 may be etched on the bottom surface 317 of the openings 314 to expose the surface 100a of the semiconductor substrate 100. In embodiments, the layers 319, 306, 303 may be etched using an anisotropic etching process, such as a sidewall spacer reactive ion etch, such that horizontally extending portions of the layers 319, 306, 303, including the portions located over the bottom surfaces 317 of the openings 314, are preferentially etched relative to vertically extending portions, such as the portions of the layers 319, 306, 303 located over the sidewalls 315, 316 of the openings 314. During the etching, the sacrificial spacer layer 319 may be completely etched from over the upper insulating layer 311 and the bottom surface 317 of the openings 314, while at least a portion of the sacrificial spacer layer 319 may remain over the sidewalls 315, 316 of the openings 314, as shown in FIG. 3F. Thus, the vertically extending portions of the second gate insulating layer 306 over the sidewalls 315, 316 of the openings 314 may be protected from etching damage by the vertically extending portions (e.g., sidewall spacers 319a) of the sacrificial spacer layer 319.

The remaining sidewall spacers 319a of the sacrificial spacer layer 319 may then be removed to expose the second gate insulating layer 306 over the sidewalls 315, 316 of the opening, as shown in FIG. 3G. The sacrificial spacer layer 319 may be removed using any suitable process, such as by a selective wet etch.

FIGS. 3H-3I illustrate a method of forming protrusions 1B comprising a semiconductor material within the openings 314 and contacting the surface 100a of the semiconductor substrate 100, in accordance with one non-limiting embodiment. As shown in FIG. 3H, an epitaxial single crystal semiconductor layer, such as a single crystal silicon layer 321 may be epitaxially grown on the exposed major surface 100a of the substrate 100 over the bottom surfaces 317 of the openings 314. FIG. 3H illustrates the single crystal silicon layer 321 partially filling each of the openings 314. In various embodiments described in further detail below, the protrusions 1B may be formed by forming at least one layer of a second material, such as a second semiconductor material (e.g., a polycrystalline semiconductor material, such as polysilicon), a metal and/or a metal nitride, over the epitaxial single crystal semiconductor layer 321 within each of the openings 314. In the embodiment shown in FIG. 3I, the protrusions 1B may be formed by completely filling the openings 314 with the single crystal silicon layer 321. The layer 321 may optionally be planarized, such as by chemical mechanical polishing (CMP), to remove any portions of the layer 321 extending above the top of the openings 314 and to define a top surface 325 of the protrusions 1B, which may be made planar with the top surface of the upper insulating layer 311, as shown in FIG. 3I.

FIG. 3I illustrates a portion of a completed lower (e.g., source) select gate device level 50 comprising lower (e.g. source) select gate transistors 301 for a NAND string memory device. The select gate device level 50 includes a conductive select gate electrode 304 that extends generally parallel to the major surface 100a of the substrate 100 and a plurality of protrusions 1B that extend in a generally vertical direction from the major surface 100a of the semiconductor substrate 100 and are located adjacent to the select gate electrode 304. The protrusions 1B may comprise a semiconductor material 321 and may form channel portions that extend generally perpendicular to the major surface 100a of the substrate. The semiconductor channel portions 1B may comprise pillar- or rail-shaped protrusions that extend in a generally vertical direction from the semiconductor substrate 100, and may comprise epitaxial single crystal silicon, for example. Additional semiconductor channel portions 1C may be located in the substrate 100 and may extend in a direction that is generally parallel to the major surface of the substrate 100 (e.g., to the left and right or into and out of the page in FIG. 3I). The additional semiconductor channel portions 1C may electrically couple the semiconductor channel portions of the protrusions 1B to a conductive source line outside of the view of FIG. 3I. A first gate insulating layer 303 may extend generally parallel to the major surface of the substrate 100 and may be located between the select gate electrode 304 and the substrate 100. A second gate insulating layer 306 may extend generally perpendicular to the major surface of the substrate 100, and may be located between the select gate electrode 304 and first and second opposing side surfaces 323, 324 of each of the protrusions 1B.

FIGS. 4A-4I illustrate an alternative embodiment method of forming a lower (e.g., source) select gate device level 50 for a NAND string memory device. FIGS. 4A-4D are identical to FIGS. 3A-D described above, and illustrate forming the first gate insulating layer 303, the select gate electrode 304 and upper insulating layer 311 over the semiconductor substrate 100 (FIG. 4A), forming a patterned mask 313 with open portions 312 corresponding to the future locations of the openings 314 (FIG. 4B), etching the upper insulating layer 311 and the select gate electrode 304 through the mask 313 to the first gate insulating layer 303 to define the openings 314 (FIG. 4C), and forming a second gate insulating layer 306 over the upper insulating layer 306 and the openings 314, including over the sidewalls 315, 316 of the openings 314 (FIG. 4D).

In FIG. 4E, a sacrificial spacer layer 401 is formed by depositing a material that preferentially forms over the second gate insulating layer 306 on the sidewalls 315, 316 but not on the bottom surface 317 of the openings 314. The sacrificial spacer layer 401 in this embodiment may comprise carbon, and may be deposited by any suitable process, such as CVD. The selective formation of a carbon spacer layer 401 on the sidewalls 315, 316 but not on the bottom surface 317 may be promoted by controlling the parameters of the carbon deposition, such as the carbon deposition temperature, the thickness of the carbon layer 401 and the aspect ratio of the openings 314. The deposition parameters may otherwise be similar to non-conformal deposition processes The first and second gate insulating layers 303, 306 may then be etched on the bottom surface 317 of the openings 314, such as via reactive ion etching, to expose the surface 100a of the semiconductor substrate 100, as shown in FIG. 4F. During the etching, the sacrificial spacer layer 401 may protect the vertically extending portions of the second gate insulating layer 306 over the sidewalls 315, 315 of the openings 314 from etching damage. Following the etching, the sacrificial spacer layer 401 may be removed, such as by ashing (e.g., when the layer 401 comprises carbon), as shown in FIG. 4F. Thus, in this embodiment, a separate etching step (e.g., a wet chemical etch) to remove the sacrificial spacer layer 319 (see FIG. 3G) may not be required.

FIG. 4G is identical to FIG. 3H and shows a single crystal silicon layer 321 epitaxially grown on the exposed major surface 100a of the substrate 100 and partially filling each of the openings 314. Unlike in the embodiment of FIGS. 3H-3I, however, the single crystal silicon layer 321 does not completely fill the openings 314. A layer of a second material, which in this embodiment comprises doped or undoped polysilicon 403, is formed over the single crystal silicon layer 321 and the upper insulating layer 311, as shown in FIG. 4H. The polysilcon layer 403 may be formed by plasma enhanced chemical vapor deposition (PECVD), for example. The use of polysilicon 403 to partially fill the openings 314, as shown in FIGS. 4H-4I may result in lower cost than the use of only single crystal silicon 321 as shown in FIGS. 3H-3I. Further, the growth rate of polysilicon 403 from epitaxial single crystal silicon 321 in the vertical direction may be relatively high, which may promote selective formation of the polysilicon layer 403 over the single crystal silicon layer 321 within the openings 314. Alternatively, a polycrystalline semiconductor (e.g., silicon) layer (doped or undoped) may be formed to fill the entire opening 314 and may then be recrystallized by thermal treatment or by laser annealing to form a single crystal semiconductor material.

The polysilicon layer 403 may be planarized, such as by an etch back or CMP, to remove portions of the layer 403 extending above the top of the openings 314, such that the top of layer 403 is planar with the top of the upper insulating layer 311, as shown in FIG. 4I. Alternatively, layer 403 may be formed using selective epitaxial growth and the planarization step may be omitted. For example, as described in U.S. Pat. No. 6,998,305, the concentration of HCl during polysilicon deposition may be controlled such that the polysilicon layer 403 does not deposit on insulating layer 311. FIG. 4I shows the completed lower (e.g. source) select gate device level 50, and is similar to FIG. 3I. In the embodiment of FIG. 4I, the protrusions 1B include a polysilicon layer 403 over a single crystal silicon layer 321 that contacts the semiconductor substrate 100. Alternatively, the single crystal silicon layer 321 may fill the entire openings 314 following use of the carbon mask 401.

Figure 5A:
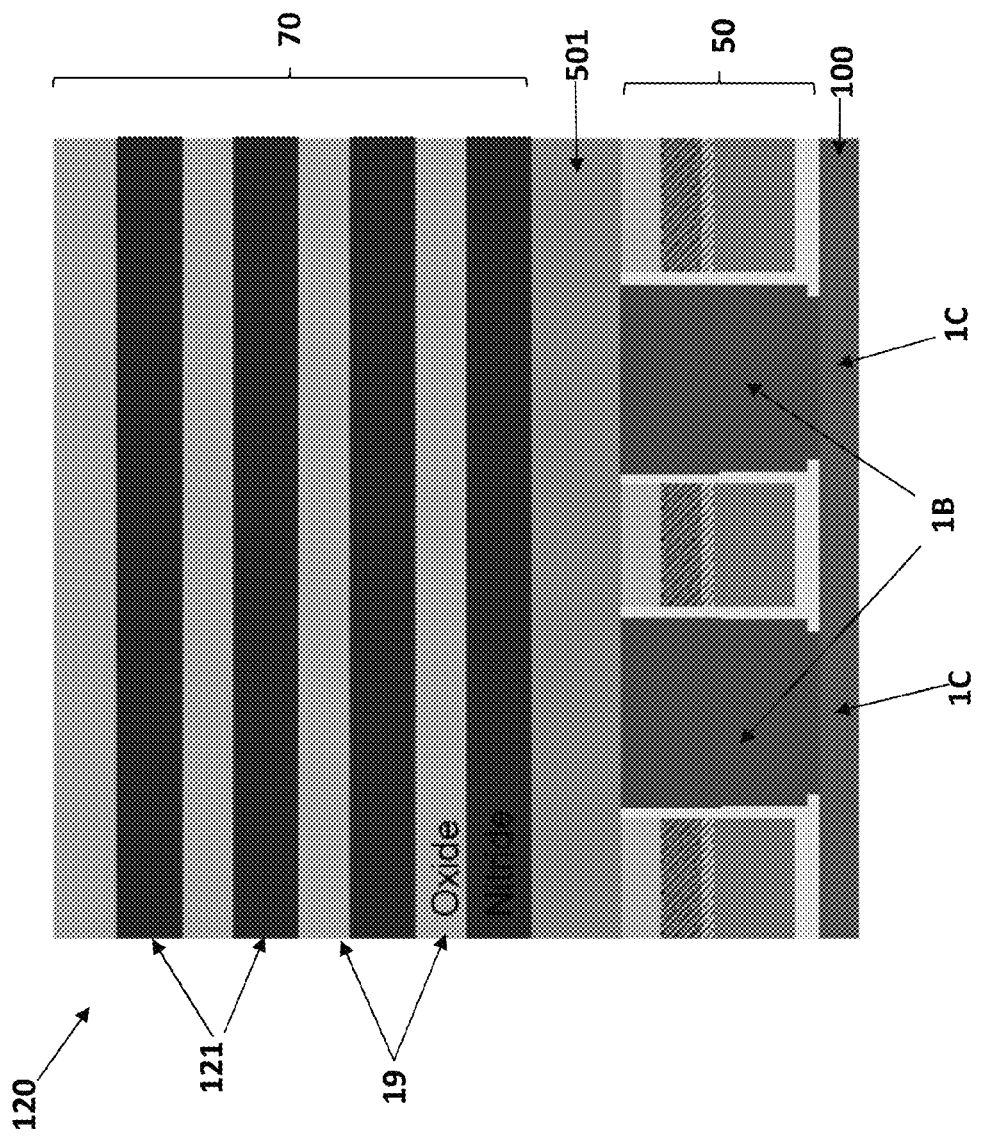

A monolithic three-dimensional NAND string memory device may be fabricated by providing a stack 120 of alternating layers of a first material 19 and a second material 121 different from the first material 19 over a substrate 100, and forming one or more memory openings 81 in the stack 120 that extend through the layers in a direction that is substantially perpendicular to the major surface of the substrate 100. FIGS. 5A-5J illustrate one method of forming NAND strings 150 in a stack 120 over a substrate 100. In this embodiment, the stack 120 includes a lower (e.g., source) select gate device level 50 located below the future location of the memory device levels 70 as shown in FIG. 5A. The select gate device level 50 may be formed as described above and shown in FIGS. 3A-3I and 4A-4I. Other fabrication methods and/or select gate device level 50 configurations may be used. For example, a lower select gate device level 50 may be fabricated as described in U.S. patent application Ser. No. 14/133,979, filed on Dec. 19, 2013, which is incorporated by reference herein for all purposes.

In embodiments, an etch stop layer 501 may be formed over the select gate device level 50, including over the top surfaces of the protrusions 1B, as shown in FIG. 5A. The etch stop layer 501 may comprise a material that has a relatively low etch rate using a first etch process (e.g., a reactive ion etch process). As described further below, the material of the etch stop layer 501 may have a relatively higher etch rate using a second etch process (e.g., a wet etching process). Suitable materials for the etch stop layer 501 include intrinsic polysilicon, a nitride material (e.g., silicon nitride) and/or an oxide material (e.g., silicon oxide).

The etch stop layer 501 may be formed by depositing the layer 501 over the select gate device level 50 by any suitable deposition method, such as sputtering, CVD, PECVD, MBE, ALD, etc.

The three dimensional memory device levels 70 may be fabricated over the etch stop layer 501 by depositing a plurality of alternating layers 19, 121 of a first material and a second material different than the first material as shown in FIG. 5A. Layers 19, 121 may be deposited over the etch stop layer 501 by any suitable deposition method, such as sputtering, CVD, PECVD, MBE, ALD, etc. The layers 19, 121 may be 6 to 100 nm thick.

In this embodiment, the first layers 19 comprise an electrically insulating material. Any suitable insulating material may be used, such as silicon oxide, silicon nitride, silicon oxynitride, a high-k dielectric (e.g., aluminum oxide, hafnium oxide, etc. or an organic insulating material). The second layers 121 comprise a sacrificial material, such an insulating material that is different from the material of the first layers 19. For example, layers 19 may comprise silicon oxide and layers 121 may comprise silicon nitride.

The deposition of layers 19, 121 is followed by etching the stack 120 to the etch stop layer 501 to form at least one front side opening 81 in the stack 120. An array of a front side openings 81 (e.g., cylindrical memory openings or holes) may be formed in locations where vertical channels of NAND strings 150 will be subsequently formed, as shown in FIGS. 5B and 5C.

The openings 81 may be formed by photolithography and etching, as follows. First, a memory hole mask 130 is formed over the stack and patterned to form openings 131 exposing the stack 120, as shown in FIG. 5B. Mask 130 may comprise any suitable material, such as one or more layer of photoresist and/or hard mask material. Then, the stack 120 may be etched (e.g., using reactive ion etching (RIE)) to form the openings 81 in the stack through the openings 131 in mask 130, stopping the etch at the etch stop layer 501. As discussed above, the etch stop layer 501 may comprise a material (e.g., intrinsic polysilicon, a nitride or an oxide) having a low RIE etch rate (e.g., lower than the RIE etch rate for the materials of the alternating layers 19, 121 of the stack 120). Thus, the layers 19, 121 may be more easily etched using RIE than the etch stop layer 501. The etching process used to form the front side memory openings 81 may be stopped at the etch stop layer 501 without exposing the surface of the protrusions 1B in the openings 81, as shown in FIG. 5C.

Each of the front side openings 81 (e.g., cylindrical memory openings or holes) may include a sidewall 505 that extends substantially perpendicular to the major surface of the substrate 100 and is defined by the exposed surfaces of the alternating layers 19, 121 of the first insulating material and the second sacrificial material, and a bottom 507 defined by the etch stop layer 501. The front side opening 81 may include a first width dimension (e.g., a diameter), $W_1$, at the bottom of the opening 81 proximate to the etch stop layer 501, as shown in FIG. 5C.

Figures 5D, 5E:
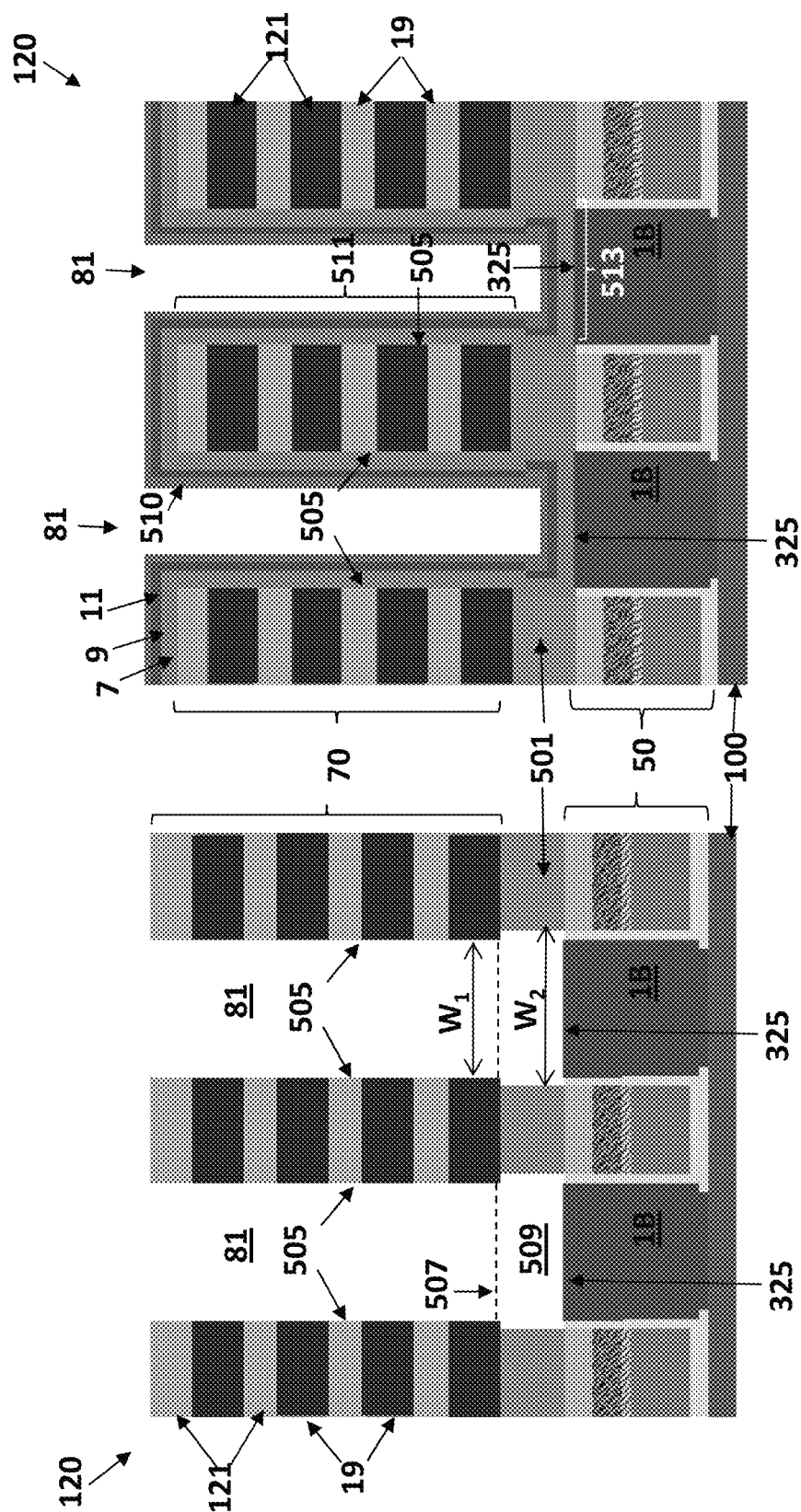

In FIG. 5D, the etch stop layer 501 may be etched through the bottom 507 of the front side openings 81 to expose the top surface 325 of the protrusion 1B. The etch stop layer 501 may be etched using a different etching process than the etching process (e.g., RIE) used to form the front side openings 81. In one embodiment, the etch stop layer 501 is etched using a wet etch process. The etch stop layer 501 may comprise a material having a high wet etch rate (e.g., higher than the wet etch rate of the materials of the alternating layers 19, 121 of the stack and the upper surface of the protrusions 1B). Thus, the etch stop layer 501 may be more easily etched using a wet etch than the sidewall 505 and bottom surface 507 of the front side openings 81.

The etching of the etch stop layer 501 through the bottom 507 of the front side opening 81 may provide a void area 509 between the bottom 507 of the opening 81 (indicated by dashed lines in FIG. 5D) and the exposed top surface 325 of the protrusion 1B. The void area 509 may have a second width dimension, $W_2$, that is larger than the first width dimension $W_1$ at the bottom 507 of the opening 81. In other words, the void area 509 formed in the etch stop layer 501 exposes a larger area of the top surface 325 of the protrusion 1B than would be exposed if the front side opening 81 were extended to the top surface 325 of the protrusion 1B (i.e., if the etch stop layer 501 were not present, and the front side memory opening 81 was formed by etching the stack 120 until the top surface 325 of the protrusion 1B is reached at the bottom of the opening 81). By exposing a larger surface area at the top surface 325 of the protrusion 1B, a more effective electrical contact may be made with the future channel 1 of the NAND string 150 formed in the opening 81, as described in further detail below.

FIGS. 5E-J illustrate a method of forming the NAND memory strings 150 within the front side memory openings 81. As shown in FIG. 5E, at least one memory film 7, 9, 11 is formed in the memory openings 81, including over the sidewalls 505 and bottom surfaces 325 of the memory openings 81, and over the stack 120. The at least one memory film includes one or more functional layers such as a blocking dielectric layer 7, a charge storage layer 9, and/or a tunneling dielectric layer 11 as described above in connection with FIGS. 1A-2. The blocking dielectric layer 7 may be formed over the sidewall 505 and bottom surface 325 of the memory opening 81, the charge storage layer 9 may be formed over the blocking dielectric layer 7, and the tunneling dielectric 11 may be formed over the charge storage layer 9 in the memory opening 81.

Then, a cover layer 510 is formed over the at least one memory film 7, 9, 11 in the memory openings 81 and over the stack 120, as shown in FIG. 5E. A purpose of the cover layer 510 is to protect the memory film 7, 9, 11 over the sidewall 505 of the memory opening 81 from damage during a subsequent etching step. The cover layer 510 may be a semiconductor material, such as amorphous silicon or polysilicon.

As shown in FIG. 5E, the at least one memory film 7, 9, 11 and the cover layer 510 may each comprise a first portion 511 that extends over the sidewall 505 of the memory opening 81 in a direction that is substantially perpendicular to the major surface of the substrate 100 and a second portion 513 that is located in the void area 509 defined by the etch stop layer 501 and extends over the top surface 325 of the protrusion 1B in a direction that is substantially parallel to the major surface of the substrate 100. As shown in FIG. 5E, each of the layers 7, 9, 11, 510 may have a first portion that 511 that extends generally vertically along the sidewall 505 of the memory opening 81, and upon reaching the void area 509 each of the layers 7, 9, 11, 510 may extend in a radially outward direction from the memory opening 81 into the void area 509. Each of the layers 7, 9, 11, 510 may have a second portion 513 that continues in a generally horizontal direction over the top surface 325 of the protrusion 1B.

A mask layer 515 may be formed over the cover layer 510 as shown in FIG. 5F. Mask layer 515 may be a hard mask, such as an amorphous carbon layer for example, and may be deposited non-conformally such that the layer 515 is located over the cover layer 510 on the top of the stack 120 but does not extend into the memory openings 81 as shown in FIG. 5F. Alternatively, the layer 515 may be deposited conformally and then patterned by photolithography and etching to be removed from the memory openings.

As shown in FIG. 5F, portions of the at least one memory film 7, 9, 11 and the cover layer 510 are removed in the horizontally-extending second portion 513 (see FIG. 5E) to define a generally cylindrically-shaped connector region 517 that exposes the top surface 325 of the protrusion 1B. The at least one memory film 7, 9, 11 and cover layer 510 may be etched using RIE or another suitable anisotropic wet or dry etching method. The cover layer 510 protects the memory film 7, 9, 11 along the sidewalls 505 of the memory openings 81 from etching damage and the mask layer 515 protects the rest of the stack 120 from being etched. The mask layer 515 may be removed using any suitable method, such as ashing or selective wet etching. Alternatively, the mask layer 515 is omitted and a sidewall spacer anisotropic etch may be used to remove the horizontal portions of layers 7, 9, 11 and 510 while leaving the vertical portions of these layers in place as sidewall spacers. The anisotropic etch may be followed by a selective wet etch.

Figure 5J:
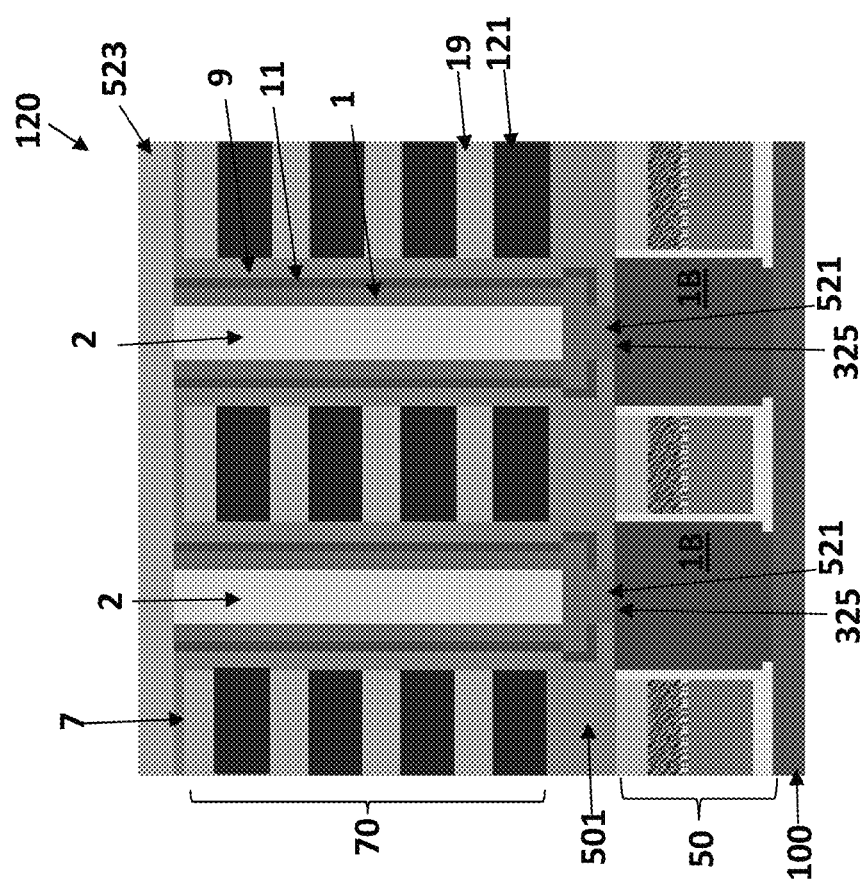

In FIG. 5G, a semiconductor channel material 519 is formed in the memory openings 81 and within the connector region 517 such that it makes contact with the top surface 325 of the semiconductor channel protrusions 1B. The semiconductor channel material 519 comprises a channel material, such as amorphous silicon or polysilicon. The cover layer 510 and the semiconductor channel material 519 preferably comprise the same materials, and layer 519 contacts layer 510 on the sidewalls 505 of the openings 81. Together, layers 519 and 510 may form the semiconductor channel 1 as illustrated in FIGS. 1A-2. The at least one memory film 7, 9, 11 may be located between the semiconductor channel 1 and the sidewall 505 of the memory opening 81. The semiconductor channel 1 fills the connector region 517 to form a generally-cylindrically-shaped connector 521 that connects the semiconductor channel 1 to the top surface 325 of the protrusion 1B. An optional core insulating layer 2, such as a silicon oxide layer may be deposited in the openings 81 and over the stack 120 as shown in FIG. 5H. Layer 2 is also shown in FIGS. 1A and 1B. The stack 120 may then be planarized as shown in FIG. 5I to remove layers 2, 519, 510, 11 and 9 from the top of the stack 120. Alternately, the stack 120 may be recessed by a dry etch process (e.g., RIE) to remove layers 2, 519, 510, 11 and 9 from the top of the stack 120 as shown in FIG. 5I. The film of dielectric material 7 may optionally be left over the top of the stack 120. In FIG. 5J, an insulating layer 523 may be formed over the stack 120, including over the memory openings 81. The insulating layer 523 may be a silicon oxide layer and may be formed by a suitable process (e.g., CVD) using a tetraethyl orthosilicate (TEOS) source.

Figure 6A:
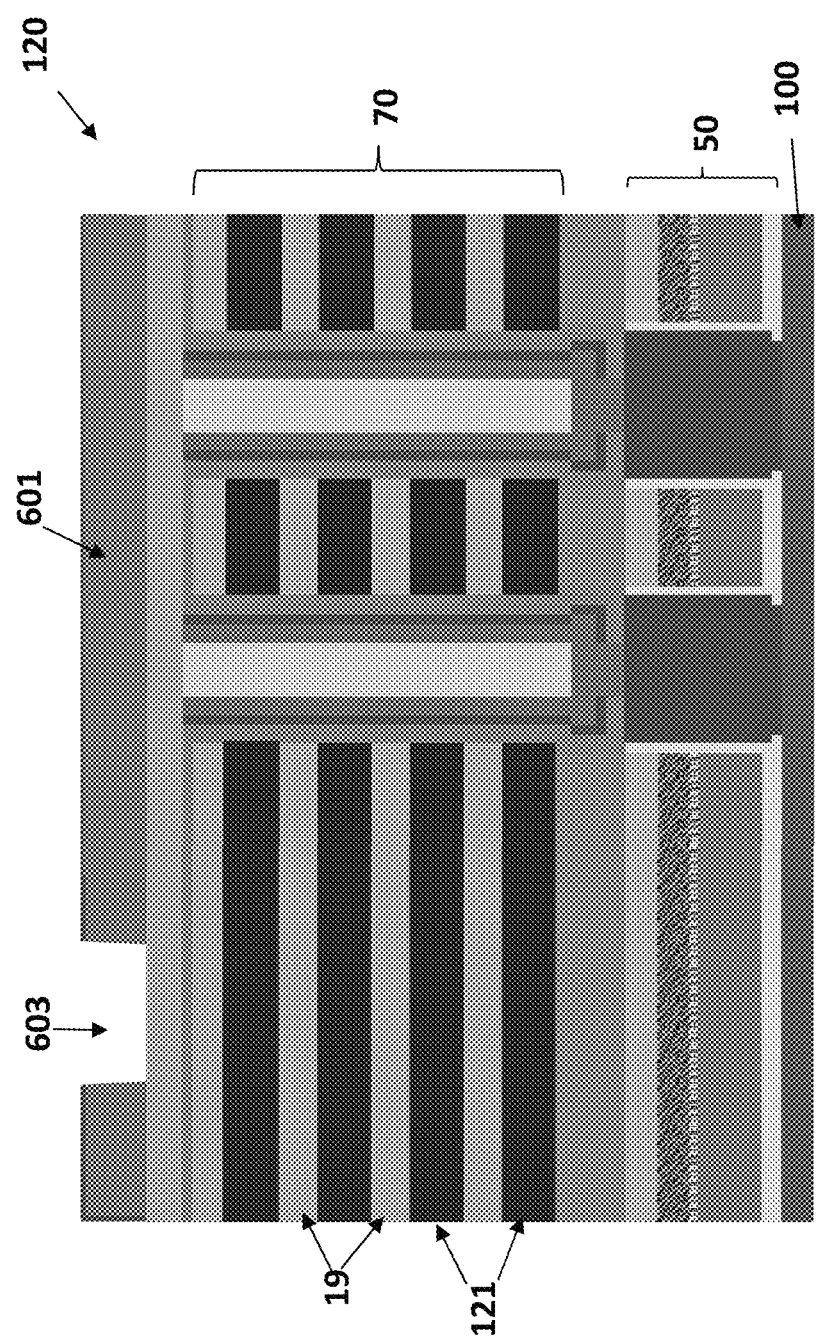
FIGS. 6A-6E are partial side cross-sectional views of a material layer stack that illustrate a method of forming control gate electrodes and a select line for a plurality of NAND memory strings.
Figure 6B:
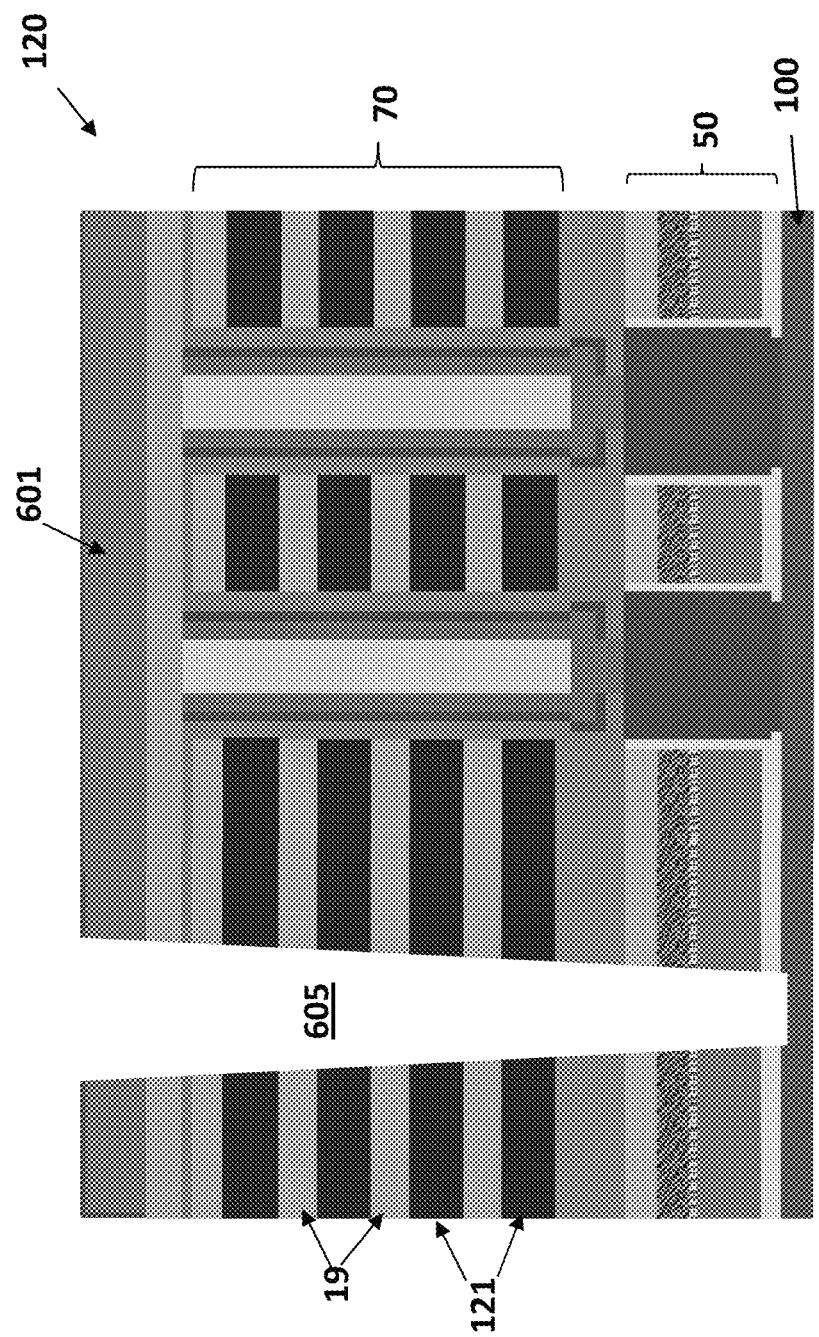

FIGS. 6A-6E illustrate additional processing steps that may be performed to remove the layers of sacrificial material 121 from the stack 120 and form control gate electrodes 3 for a vertical NAND memory string 150. As shown in FIG. 6A, a mask 601 may be formed over the top of the stack 120. The mask 601 may be a photoresist and/or hard mask. At least one back side mask opening 603 is formed in the mask. Then, as shown in FIG. 6B, the stack 120 is etched through the opening(s) 603 in the mask to form one or more back side openings (e.g., trenches) 605 in the stack 120.

Figure 6C:
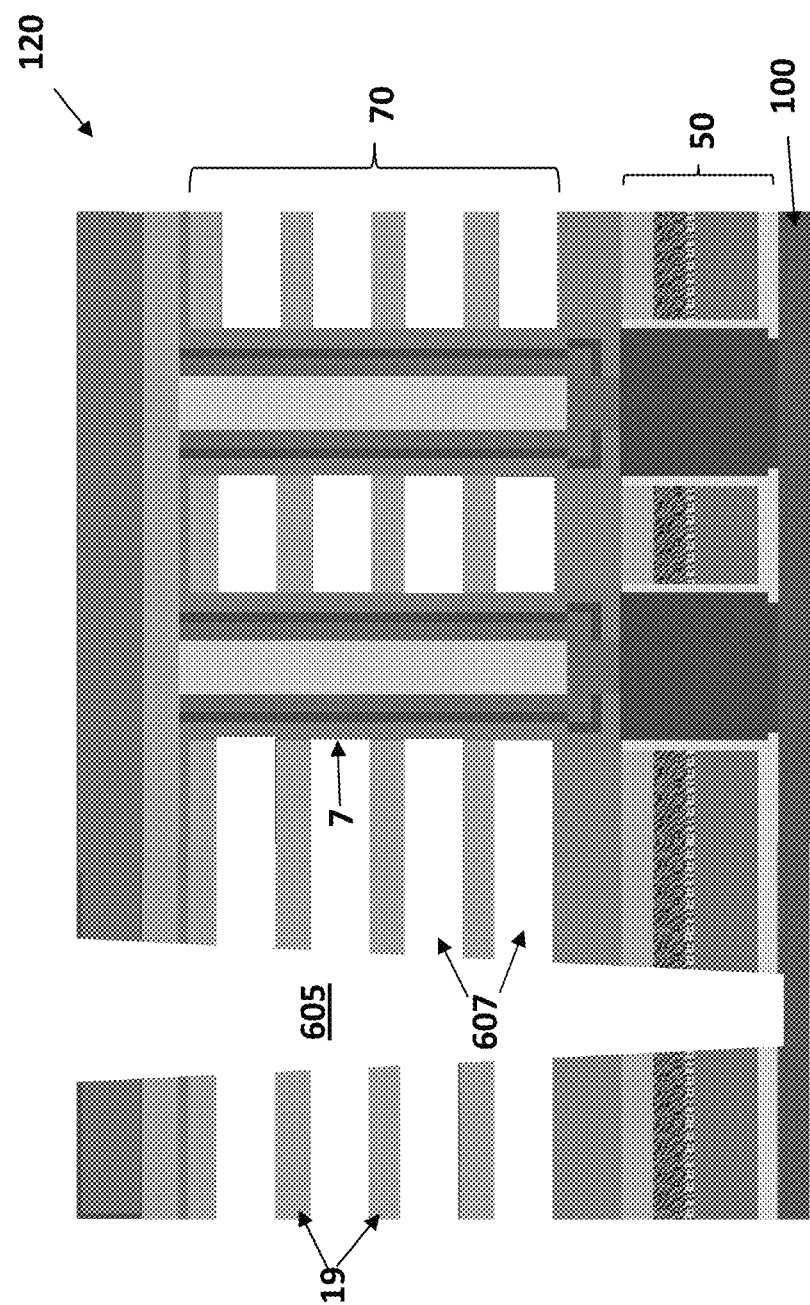

Then, at least a portion of the sacrificial second material layers 121 may be removed through the back side openings 605 to form back side recesses 607 between the first material layers 19, as shown in FIG. 6C. Layers 121 may be removed by selective etching, such as a silicon nitride selective etching which removes silicon nitride layers 121 but does not remove the silicon oxide layers 19. The selective etch may stop on the oxide blocking dielectric 7, such as a silicon oxide blocking dielectric, that extends vertically in the memory openings 81.

Figure 6D:
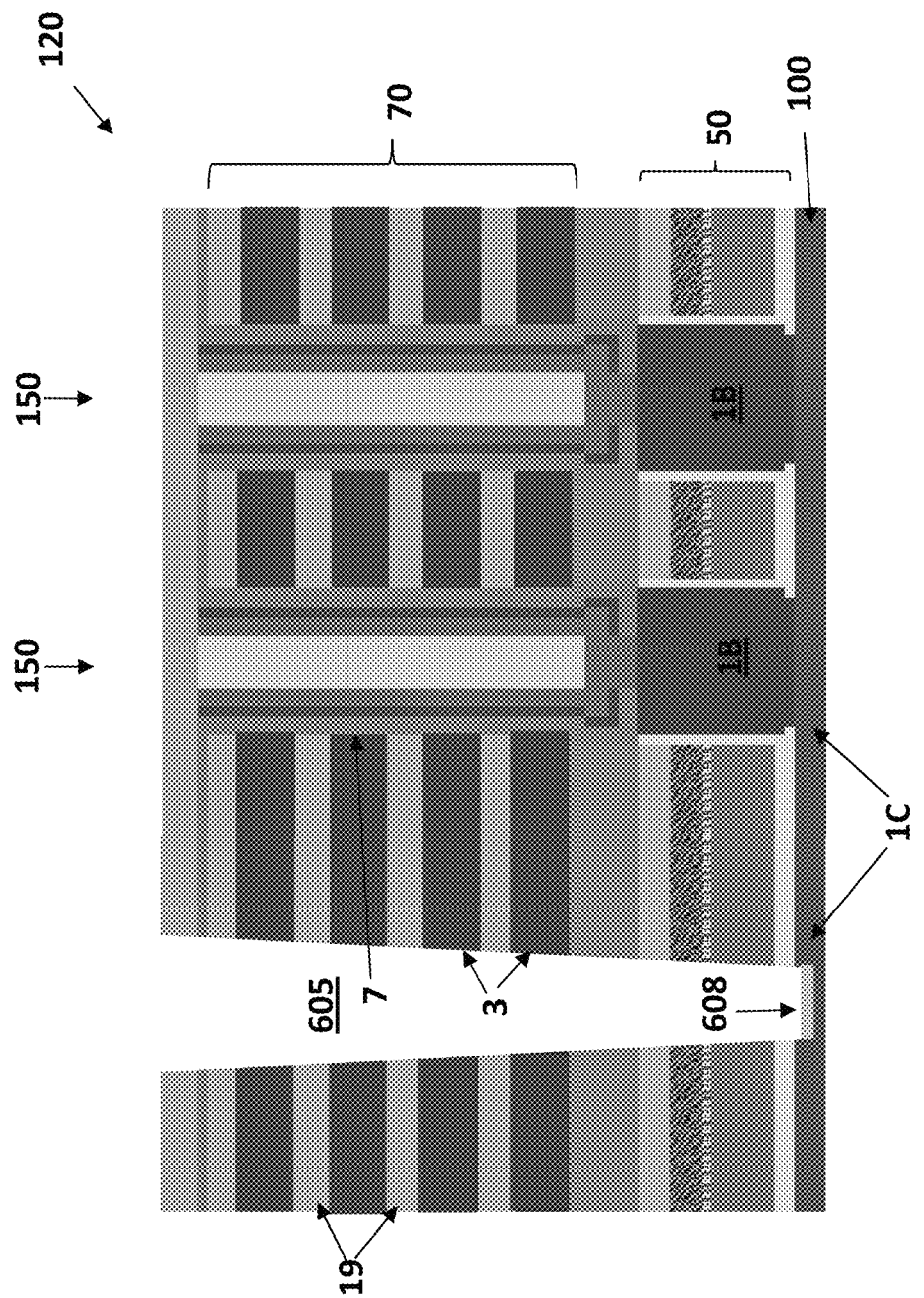

Electrically conductive control gate electrodes 3 may then be formed in the back side recesses 607 through the back side opening 605, as shown in FIG. 6D. The control gate electrode 3 material may comprise any suitable material described above with respect to FIGS. 1A-2. For example, the material may comprise a TiN liner and tungsten gate material. The electrodes 3 may be formed by forming the electrically conductive control gate electrode material to partially or completely fill the back side opening 605 and to fill the back side recesses 607 such that the control gate electrode 3 material contacts the dielectric film 7 along the sidewalls of the memory openings 81. The electrode material may then be removed from the back side opening 605 (e.g., using anisotropic etching) without removing the material forming the electrodes 3. An optional doped source region 608 may be implanted into channel region 1C in the substrate 100 through the backside opening 605. The source region 608 may be doped opposite conductivity type (e.g., n-type) from the conductivity type (e.g., p-type) of the channel region 1C.

Figure 6E:
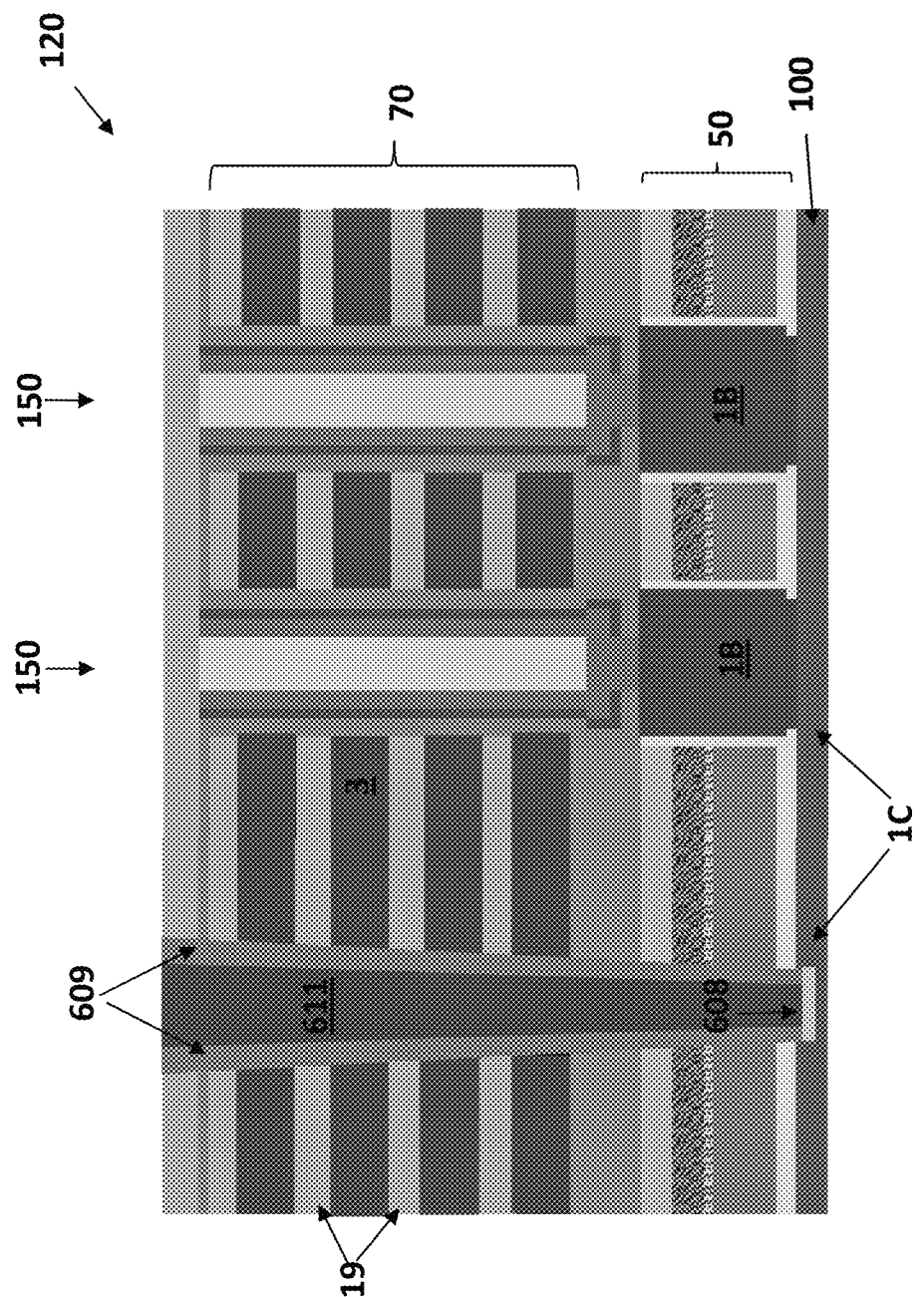

Then, as shown in FIG. 6E, an insulating layer 609, such as a silicon oxide or silicon nitride layer is formed on the sidewalls of the backside opening 605 such that the bottom surface of the backside opening 605 (e.g., the upper major surface of the semiconductor substrate 100) is exposed. A conductive source line 611 (e.g., a metal or metal nitride line, such as W, Ti, TiN, etc.) is then formed over the insulating layer 609 in the backside opening 605 such that the source line 611 contacts the source region 608 which in turn contacts the channel region 1C in the substrate 100. This forms an electrical connection between the source line and the channel portions 1, 1B and 1C. An upper (e.g., drain side) select gate electrode and transistor (not shown for clarity) may also be formed above the memory levels 70 of each NAND string 150.

Figures 7C, 7D:
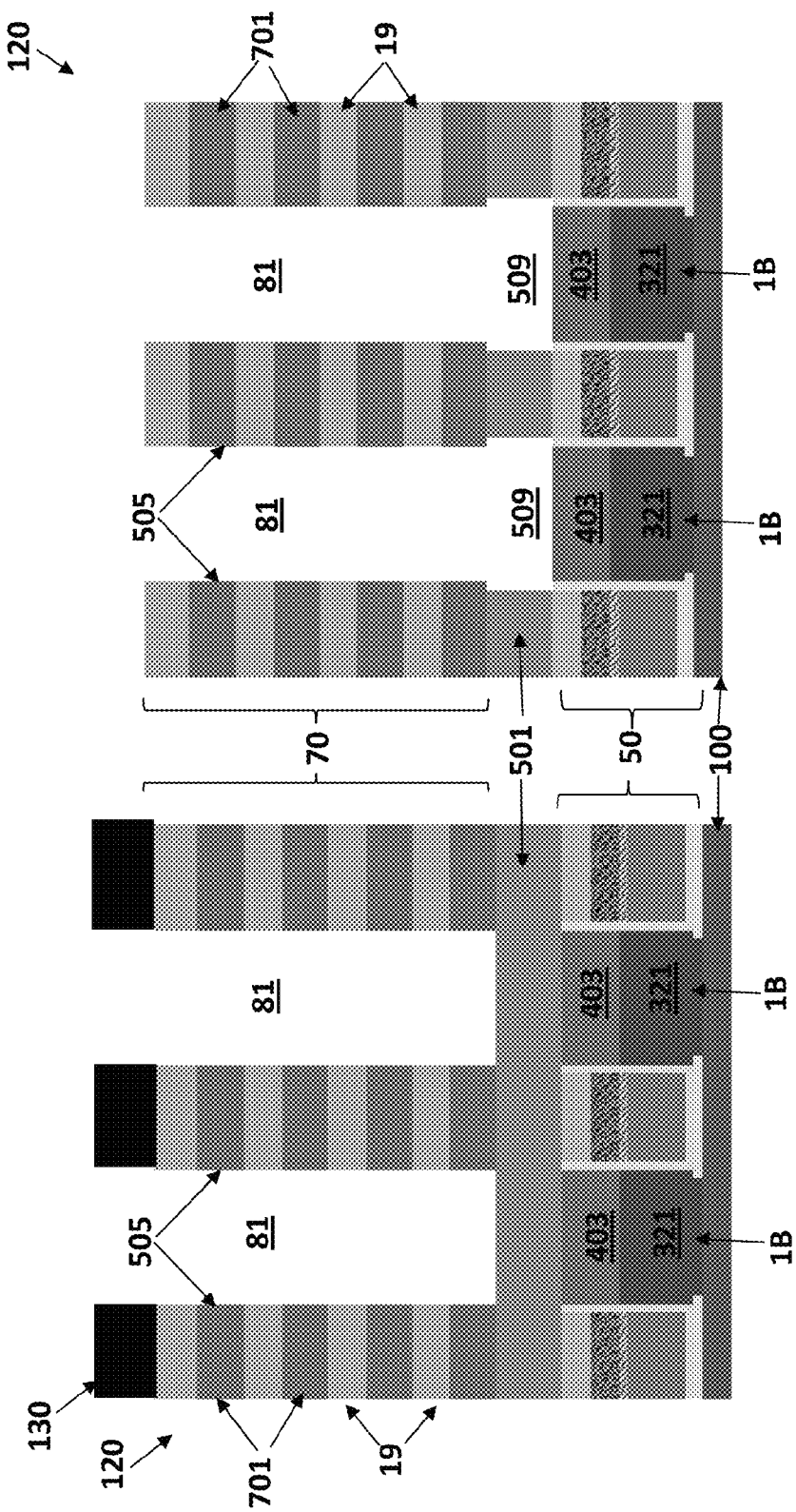

FIGS. 7I-7J illustrate an alternative method of forming NAND strings 150 in a stack 120 over a substrate 100. The stack 120 in FIG. 7I-7J differs from the stack 120 in FIGS. 5A-5J and 6A-6E in that instead of alternating layers of a first insulating (e.g., an oxide, such as silicon oxide) material 19 and a second sacrificial (e.g., a nitride, such as silicon nitride) material 121, the stack 120 in FIGS. 7I-7J includes alternating layers of a first insulating (e.g., an oxide, such as silicon oxide) material and a second semiconductor (e.g., silicon, such as polysilicon) material 701 (e.g., an OPOP stack). In addition, as shown in FIG. 7A, the protrusion 1B in the lower (e.g., source) select gate level 50 includes an upper polysilicon layer 403 over a lower epitaxial single crystal silicon layer 321 that contacts the surface of the substrate 100, such as shown in FIGS. 4A-4I. The method of FIGS. 7I-7J is otherwise substantially identical to the method of FIGS. 5A-5J described above. For example, the stack 120 is etched through a mask 130 to an etch stop layer 501 located above the lower (e.g., source) select gate memory level 50 to form an array of front side memory openings 81 (FIGS. 7B-7C), and the etch stop layer 501 is etched through each of the memory openings 81 to provide a void area 509 between the bottom of the memory opening 81 and the surface of the upper polysilicon layer 403 of the protrusion 1B (FIG. 7D). Then, at least one memory film 7, 9, 11 and a semiconductor cover layer 510 are formed over the sidewall 505 of the memory openings 81 and the top surface of the protrusion 1B (FIG. 7E), the at least one memory film 7, 9, 11 and the cover layer 510 are etched to form a generally-cylindrical connector region 517 that exposes the top surface of the protrusion 1B (FIG. 7F), and a semiconductor channel material 519 is formed in the memory opening 81 and the connector region 517 to provide a semiconductor channel 1 having a generally cylindrically-shaped connector 521 located within the connector region 517 and contacting the polysilicon upper layer 403 of the protrusion 1B (FIG. 7G). The at least one memory film 7, 9, 11 may be located between the semiconductor channel 1 and the sidewall 505 of the memory opening. An optional insulating fill material 2 may be formed over the stack 120 and within the memory openings 81 (FIGS. 7H-7I) and an insulating layer 523 (e.g., an oxide layer formed using a TEOS source) may be provided over the stack (FIG. 7J).

Figure 8A:
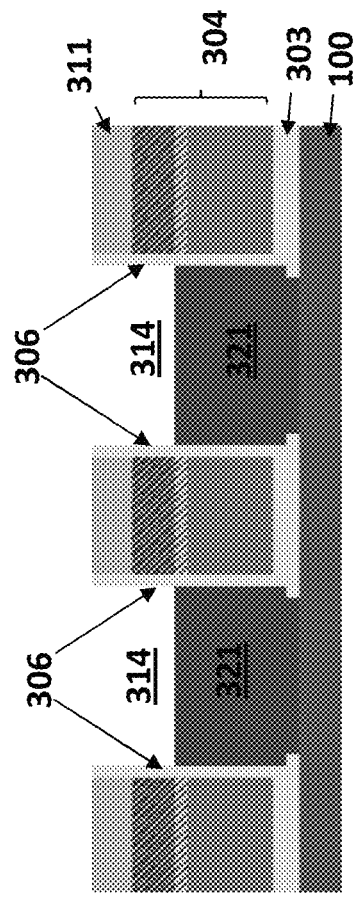
Figure 8B:
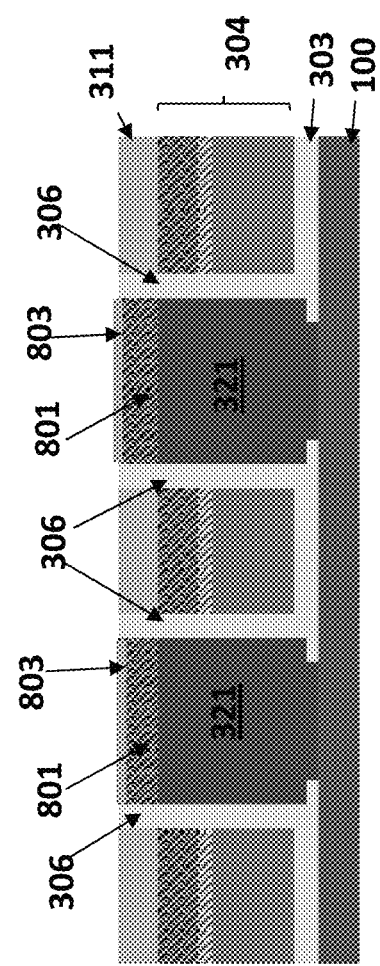

FIGS. 8A-8F illustrate yet another embodiment method of fabricating a NAND string memory device. FIG. 8A illustrates a lower (e.g., source) select gate device level 50 and illustrates a plurality of openings 314 partially filled with an epitaxial single crystal silicon material 321, as described above in FIGS. 3H and 4G. In this embodiment, instead of completely filling the openings 314 with a semiconductor material (e.g., epitaxial single crystal silicon as shown in FIG. 3I, or epitaxial single crystal silicon and polysilcon as shown in FIG. 4H-4I), the protrusions 1B are formed by forming at least one metal and/or metal nitride material layer over a semiconductor layer (e.g., epitaxial single crystal silicon layer 321) that contacts the semiconductor substrate 100. A layer 801 of a metal or metal nitride material may be formed over the epitaxial silicon layer 321 as shown in FIG. 8B. The metal or metal nitride material is preferably a refractive metal or metal alloy that may withstand a high temperature annealing process (e.g., laser annealing). Suitable materials include, without limitation, tungsten, tungsten nitride, tantalum, titanium, titanium nitride, and cobalt. A cap layer 803 may be provided over the metal or metal nitride layer 801, and may comprise a silicon oxide material formed by CVD using a silane (p-SiH$_4$) source.

FIG. 8C shows the lower (e.g., source) select gate device level 50 with protrusions 1B comprising a semiconductor material 321 and an upper metal or metal nitride layer 801 with a cap layer 803. A material layer stack 120 and etch stop layer 501 are formed over the select gate device level 50 as described above in connection with FIGS. 5A and 7A. The stack 120 may be processed to form front side memory openings 81 for a NAND string, as described above in connection with FIGS. 5A-E and 7A-7E.

FIG. 8D corresponds with FIGS. 5F and 7F described above, and shows the stack 120 with at least one memory film 7, 9, 11 and a cover layer 510 (e.g., a semiconductor channel material, such as polysilicon or amorphous silicon) formed over the sidewalls 505 of each of the memory openings 81. A portion of the memory film 7, 9, 11, cover layer 510, and cap layer 803 are removed (e.g., etched through a mask) from the bottom of the memory opening 81 to form a generally-cylindrical connector region 517 that exposes the surface of the metal or metal nitride layer 801 of the protrusion 1B, as shown in FIG. 8D.

Figures 8E, 8F:
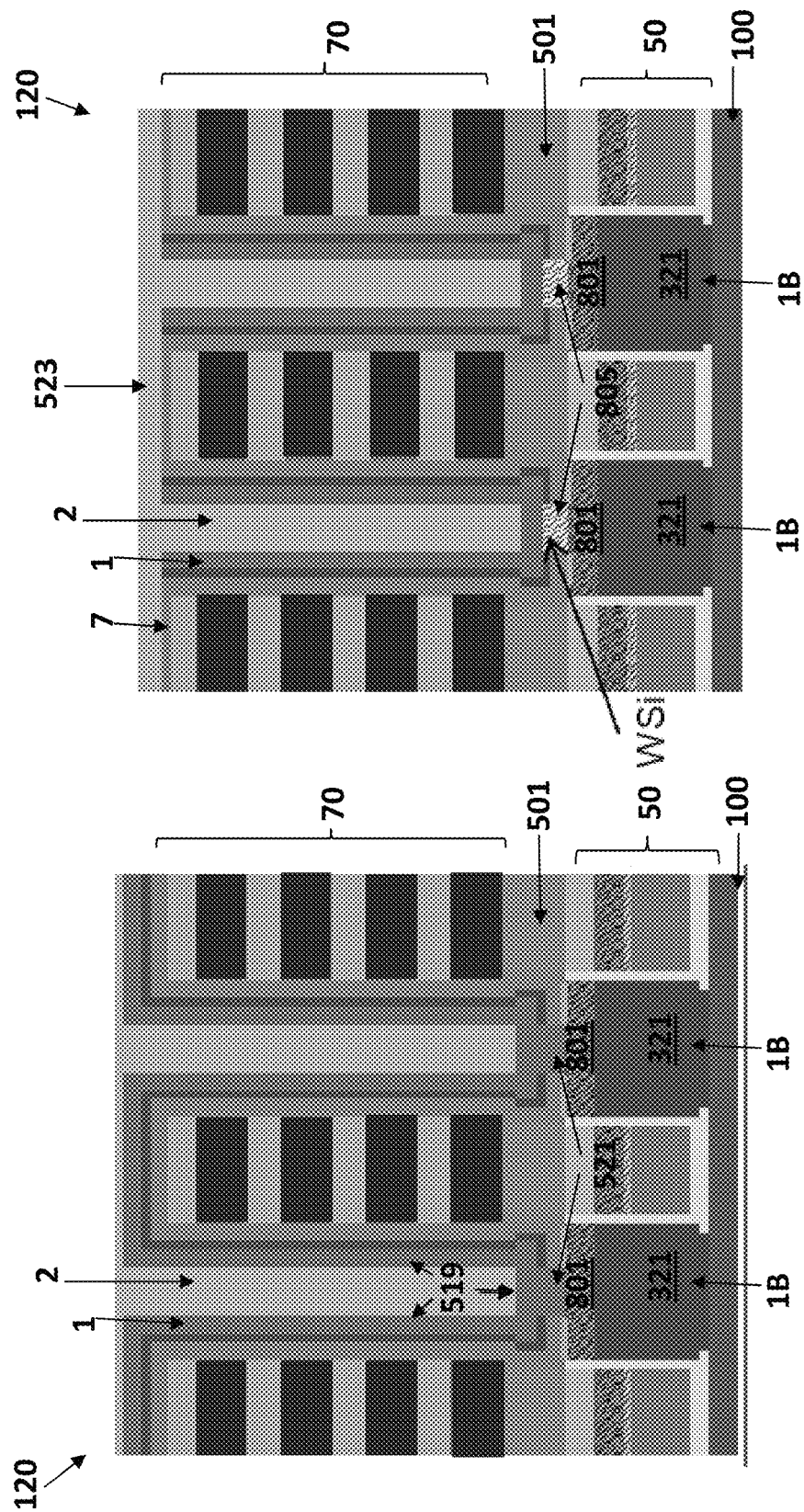

A semiconductor channel material 519 (e.g., polysilicon or amorphous silicon) may be formed in the memory opening 81 and in the connector region 517 to provide a semiconductor channel 1 having a generally cylindrically-shaped connector 521 located within the connector region 517 and contacting the exposed surface of the metal or metal nitride layer 801 of the protrusion 1B, as shown in FIG. 8E. The at least one memory film 7, 9, 11 may be located between the semiconductor channel 1 and the sidewall 505 of the memory opening 81. An optional insulating fill material 2 may be formed to fill the hollow part of the memory openings 81 surrounded by the semiconductor channel 1.

In FIG. 8F, the device may be annealed, and in particular may be selectively annealed at elevated temperature to convert at least a portion of the material at the interface between the semiconductor channel 1 and the upper metal or metal nitride layer 801 of the protrusion 1B to a metal silicide material 805. In embodiments, the cylindrically-shaped connector 521 may be reacted with the metal or metal nitride layer 801 to at least partially convert the connector 521 to a metal silicide material 805. The metal silicide material 805 may comprise, for example, $WSi_2$, $TaSi_2$, TiSiN, $TiS_2$ and $CoSi_2$. The particular metal silicide material 805 may depend on the material used for the upper metal or metal nitride layer 801 (e.g., a tungsten metal layer 801 forms a tungsten silicide layer 805). The selective annealing process may comprise a laser anneal (e.g., directing a beam from a laser source through the oxide fill material 2, which may be optically transmissive, to heat the cylindrically-shaped connector 521 at the interface between the semiconductor channel 1 and the metal layer 801 and convert at least a portion of the connector 521 to a metal silicide material 805. The stack 120 may also be planarized to the film of dielectric material 7, and an insulating layer 523 may be formed over the stack 120 as shown in FIG. 8F.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of fabricating a memory device, comprising:
    forming a protrusion comprising a semiconductor material over a major surface of a semiconductor substrate, the protrusion having a top surface substantially parallel to the major surface of the substrate;
    forming an etch stop layer over the top surface of the protrusion;
    forming a stack of alternating layers of a first material and a second material different from the first material over the etch stop layer;
    etching the stack through a mask to the etch stop layer to form a memory opening having a first width dimension proximate to the etch stop layer;
    etching the etch stop layer to provide a void area between the top surface of the protrusion and a bottom of the memory opening, the void area having a second width dimension that is larger than the first width dimension;
    forming at least a portion of a memory film over a sidewall of the memory opening and within the void area over the top surface of the protrusion;
    etching the memory film to expose the top surface of the protrusion; and
    forming a semiconductor channel in the memory opening such that the semiconductor channel is electrically coupled to the protrusion and the at least a portion of the memory film is located between the semiconductor channel and the sidewall of the memory opening,
    wherein the method further comprises at least one feature selected from:

(a) the stack is etched to the etch stop layer using a first etching process and the etch stop layer is etched to provide the void area using a second etching process different than the first etching process, and the etch stop layer comprises a material with a higher etch rate using the second etching process than with the first etching process;
    (b) the etch stop layer comprises intrinsic polysilicon;
    (c) the etch stop layer comprises at least one of a nitride and an oxide material;
    (d) the memory film comprises a blocking dielectric, a charge trapping layer or floating gate and a tunnel dielectric, and the tunnel dielectric is located between the charge trapping layer or floating gate and the semiconductor channel; or
    (d) etching the memory film to expose the top surface of the protrusion comprises forming a generally cylindrically-shaped opening through the memory film in the void area to expose the top surface of the protrusion, and forming the semiconductor channel comprises forming a generally cylindrically-shaped protruding region of the semiconductor channel within the generally cylindrically-shaped opening such that a bottom surface of the protruding region contacts the top surface of the protrusion.

2. The method of claim 1, wherein the method further comprises feature (a) wherein the stack is etched to the etch stop layer using the first etching process and the etch stop layer is etched to provide the void area using the second etching process different than the first etching process, and the etch stop layer comprises the material with the higher etch rate using the second etching process than with the first etching process.

3. The method of claim 2, wherein the etch stop layer comprises a material with a higher etch rate than the stack and the protrusion using the second etching process.

4. The method of claim 2, wherein the first etching process comprises a reactive ion etching process and the second etching process comprises a wet etching process.

5. The method of claim 1, wherein the method further comprises feature (b) wherein the etch stop layer comprises intrinsic polysilicon.

6. The method of claim 1, wherein the method further comprises feature (c) wherein the etch stop layer comprises at least one of the nitride and the oxide material.

7. The method of claim 1, wherein the method further comprises feature (d) wherein the memory film comprises the blocking dielectric, the charge trapping layer or floating gate and the tunnel dielectric, and the tunnel dielectric is located between the charge trapping layer or floating gate and the semiconductor channel.

8. The method of claim 7, wherein the memory device comprises a three dimensional monolithic NAND string and wherein the second material layers comprise control gate electrodes or sacrificial layers which are replaced with conductive control gate electrodes after forming the semiconductor channel.

9. The method of claim 1, wherein the method further comprises feature (e) wherein etching the memory film to expose the top surface of the protrusion comprises forming the generally cylindrically-shaped opening through the memory film in the void area to expose the top surface of the protrusion, and forming the semiconductor channel comprises forming the generally cylindrically-shaped protruding region of the semiconductor channel within the generally cylindrically-shaped opening such that the bottom surface of the protruding region contacts the top surface of the protrusion.

10. A method of fabricating a memory device, comprising:
forming a protrusion comprising a semiconductor material over a major surface of a semiconductor substrate, the protrusion having a top surface substantially parallel to the major surface of the substrate;
forming an etch stop layer over the top surface of the protrusion;
forming a stack of alternating layers of a first material and a second material different from the first material over the etch stop layer;
etching the stack through a mask to the etch stop layer to form a memory opening having a first width dimension proximate to the etch stop layer;
etching the etch stop layer to provide a void area between the top surface of the protrusion and a bottom of the memory opening, the void area having a second width dimension that is larger than the first width dimension;
forming at least a portion of a memory film over a sidewall of the memory opening and within the void area over the top surface of the protrusion;
etching the memory film to expose the top surface of the protrusion;
forming a semiconductor channel in the memory opening such that the semiconductor channel is electrically coupled to the protrusion and the at least a portion of the memory film is located between the semiconductor channel and the sidewall of the memory opening;
forming a sacrificial semiconductor layer over the at least a portion of the memory film along the sidewall of the memory opening and in the void area over the top surface of the protrusion; and
etching the sacrificial semiconductor layer and the memory film to expose the top surface of the protrusion, wherein the semiconductor channel is formed over the sacrificial semiconductor layer along at least the sidewall of the memory opening.

11. The method of claim 10, wherein the sacrificial semiconductor layer comprises intrinsic polysilicon.

12. A method of fabricating a memory device, comprising:
forming a protrusion comprising a semiconductor material over a major surface of a semiconductor substrate, the protrusion having a top surface substantially parallel to the major surface of the substrate;
forming an etch stop layer over the top surface of the protrusion;
forming a stack of alternating layers of a first material and a second material different from the first material over the etch stop layer;
etching the stack through a mask to the etch stop layer to form a memory opening having a first width dimension proximate to the etch stop layer;
etching the etch stop layer to provide a void area between the top surface of the protrusion and a bottom of the memory opening, the void area having a second width dimension that is larger than the first width dimension;
forming at least a portion of a memory film over a sidewall of the memory opening and within the void area over the top surface of the protrusion;
etching the memory film to expose the top surface of the protrusion; and
forming a semiconductor channel in the memory opening such that the semiconductor channel is electrically coupled to the protrusion and the at least a portion of the memory film is located between the semiconductor channel and the sidewall of the memory opening;
wherein:
the protrusion comprises a rail or pillar shaped channel of a select gate transistor having a first side surface and a second side surface opposite the first side surface;
a select gate electrode extends generally parallel to the major surface of the substrate and adjacent to the first and second side surfaces of the protrusion; and
a gate insulating layer is located between the select gate electrode and the first and second side surfaces of the protrusion.

13. The method of claim 12, wherein the protrusion comprises epitaxially-grown silicon and at least one additional material layer over the epitaxially-grown silicon, wherein the at least one additional material layer comprises at least one of an additional semiconductor material, a metal and a metal nitride.

14. The method of claim 13, wherein the at least one additional material layer comprises polysilicon that is formed over the epitaxially-grown silicon using plasma enhanced chemical vapor deposition.

15. The method of claim 13, wherein the at least one additional material layer comprises at least one of a metal and a metal nitride, the method further comprising selectively annealing the memory device to form a metal silicide in an interface region between the semiconductor channel and the protrusion.

16. The method of claim 15, wherein the selective annealing is performed using a laser.

17. The method of claim 16, wherein the metal silicide comprises at least one of $WSi_2$, $TaSi_2$, $TiSiN$, $TiSi_2$ and $CoSi_2$.

* * * * *